United States Patent
Maki

(10) Patent No.: US 9,627,594 B2
(45) Date of Patent: *Apr. 18, 2017

(54) LIGHT EMITTING DEVICE AND METHOD FOR MANUFACTURING THE SAME

(71) Applicant: Toshiba Hokuto Electronics Corporation, Asahikawa-Shi (JP)

(72) Inventor: Keiichi Maki, Asahikawa (JP)

(73) Assignee: Toshiba Hokuto Electronics Corporation, Asahikawa-Shi (JP)

(*) Notice: Subject to any disclaimer, the term of this patent is extended or adjusted under 35 U.S.C. 154(b) by 0 days.

This patent is subject to a terminal disclaimer.

(21) Appl. No.: 15/014,307

(22) Filed: Feb. 3, 2016

(65) Prior Publication Data

US 2016/0155913 A1  Jun. 2, 2016

Related U.S. Application Data

(63) Continuation of application No. 14/858,241, filed on Sep. 18, 2015, now Pat. No. 9,306,132, which is a
(Continued)

(30) Foreign Application Priority Data

Mar. 28, 2013 (JP) ................. 2013-068172
Mar. 28, 2013 (JP) ................. 2013-068173

(51) Int. Cl.
   *H01L 33/00* (2010.01)
   *H01L 33/56* (2010.01)
   (Continued)

(52) U.S. Cl.
   CPC ............ *H01L 33/56* (2013.01); *H01L 24/18* (2013.01); *H01L 25/0753* (2013.01);
   (Continued)

(58) Field of Classification Search
   CPC ...... H01L 24/18; H01L 33/56; H01L 25/0753; H01L 27/156; H01L 33/54; H01L 33/62
   See application file for complete search history.

(56) References Cited

U.S. PATENT DOCUMENTS 7,052,924 B2   5/2006  Daniels et al.
7,217,956 B2   5/2007  Daniels et al.
(Continued)

FOREIGN PATENT DOCUMENTS

JP    60-262430 A1   12/1985
JP    61-6833 A1    1/1986
(Continued)

OTHER PUBLICATIONS

International Search Report and Written Opinion (Application No. PCT/JP2014/001764) dated Apr. 28, 2014.
(Continued)

*Primary Examiner* — Nicholas Tobergte
(74) *Attorney, Agent, or Firm* — Burr & Brown, PLLC

(57) ABSTRACT

A light emitting device in an embodiment includes first and second light transmissive insulators and a light emitting diode arranged between them. First and second electrodes of the light emitting diode are electrically connected to a conductive circuit layer provided on a surface of at least one of the first and second light transmissive insulators. Between the first light transmissive insulator and the second light transmissive insulator, a third light transmissive insulator is embedded which has at least one of a Vicat softening temperature of 80° C. or higher and 160° C. or lower and a tensile storage elastic modulus of 0.01 GPa or more and 10 GPa or less.

20 Claims, 15 Drawing Sheets

Related U.S. Application Data continuation of application No. PCT/JP2014/001764, filed on Mar. 27, 2014.

(51) Int. Cl.
  *H01L 23/00* (2006.01)
  *H01L 25/075* (2006.01)
  *H01L 27/15* (2006.01)
  *H01L 33/54* (2010.01)
  *H01L 33/62* (2010.01)

(52) U.S. Cl.
  CPC ............ *H01L 27/156* (2013.01); *H01L 33/54* (2013.01); *H01L 33/62* (2013.01); *H01L 2924/12041* (2013.01); *H01L 2924/15788* (2013.01); *H01L 2933/005* (2013.01)

(56) References Cited

U.S. PATENT DOCUMENTS

| | | | |
|---|---|---|---|
| 7,259,030 B2 | 8/2007 | Daniels et al. | |
| 7,294,961 B2 | 11/2007 | Daniels et al. | |
| 7,427,782 B2 | 9/2008 | Daniels et al. | |
| 7,476,557 B2 | 1/2009 | Daniels et al. | |
| 7,508,081 B2 | 3/2009 | Matsumura et al. | |
| 7,677,943 B2 | 3/2010 | Daniels et al. | |
| 7,723,733 B2 | 5/2010 | Daniels et al. | |
| 7,858,994 B2 | 12/2010 | Daniels et al. | |
| 7,863,760 B2 | 1/2011 | Daniels et al. | |
| 7,952,107 B2 | 5/2011 | Daniels et al. | |
| 8,044,415 B2 | 10/2011 | Messere et al. | |
| 8,129,730 B2 | 3/2012 | Daniels | |
| 8,450,189 B2 | 5/2013 | Shiga et al. | |
| 9,306,132 B2 * | 4/2016 | Maki | H01L 25/0753 |
| 2004/0222418 A1 | 11/2004 | Mochizuki | |
| 2007/0090387 A1 | 4/2007 | Daniels et al. | |
| 2007/0194332 A1 | 8/2007 | Daniels et al. | |
| 2008/0067527 A1 | 3/2008 | Daniels et al. | |
| 2008/0191220 A1 | 8/2008 | Daniels et al. | |
| 2009/0289381 A1 | 11/2009 | Burmeister et al. | |
| 2010/0063239 A1 | 3/2010 | Inoue et al. | |
| 2013/0102734 A1 | 4/2013 | Takaragi et al. | |
| 2014/0124257 A1 | 5/2014 | Yoshihara et al. | |

FOREIGN PATENT DOCUMENTS

| | | | |
|---|---|---|---|
| JP | 61-194732 A1 | 8/1986 | |
| JP | 11-145381 A1 | 5/1999 | |
| JP | 11-177147 A1 | 7/1999 | |
| JP | 2000-227952 A1 | 8/2000 | |
| JP | 2000-299411 A1 | 10/2000 | |
| JP | 2002-114880 A1 | 4/2002 | |
| JP | 2002-246418 A1 | 8/2002 | |
| JP | 2004-230795 A1 | 8/2004 | |
| JP | 2007-531321 A1 | 11/2007 | |
| JP | 2008-297472 A1 | 12/2008 | |
| JP | 2009-512977 A1 | 3/2009 | |
| JP | 2009-283939 A1 | 12/2009 | |
| JP | 2010-123802 A1 | 6/2010 | |
| JP | 2011-074188 A | 4/2011 | |
| JP | 2012-084855 A1 | 4/2012 | |
| JP | 2012-214812 A1 | 11/2012 | |
| JP | 2012-231018 A1 | 11/2012 | |
| JP | 2012-241147 A1 | 12/2012 | |
| JP | 5533183 B2 | 6/2014 | |
| WO | 2008/050614 A1 | 5/2008 | |
| WO | 2011/132589 A1 | 10/2011 | |

OTHER PUBLICATIONS

English translation of International Preliminary Report on Patentability (Application No. PCT/JP2014/001764) dated Oct. 8, 2015.
Japanese Office Action (Application No. 2014-216366) dated Oct. 6, 2015 (with English translation).
Japanese Office Action (Application No. 2014-216366) dated May 31, 2016 (with English translation).
European Search Report, European Application No. 14774396.7, dated Oct. 7, 2016 (7 pages).

* cited by examiner

LIGHT EMITTING DEVICE AND METHOD FOR MANUFACTURING THE SAME

CROSS REFERENCE TO RELATED APPLICATIONS

This application is a continuation of U.S. application Ser. No. 14/858,241, filed Sep. 18, 2015, which in turn is a continuation of International Application No. PCT/JP2014/001764, filed Mar. 27, 2014, which designated the United States, and claims the benefit under 35 USC §119(a)-(d) of Japanese Patent Application Nos. 2013-068172 and 2013-068173, filed Mar. 28, 2013, the entireties of which are incorporated herein by reference.

FIELD OF THE INVENTION

The present invention relates to a light emitting device and a method for manufacturing the same.

BACKGROUND OF THE INVENTION

A light emitting device using a light emitting diode (LED) is widely used for optical devices such as indoor, outdoor, stationary, mobile display devices, display lamps, various switches, signal devices, general lightings and so on. Among the light emitting devices using LEDs, as a device suitable for display devices that display various character strings, geometrical figures and patterns and the like and a display lamp, a transparent light emitting device is known in which a plurality of LEDs are arranged between two transparent substrates. Using a flexible substrate made of a transparent resin as the transparent substrate eases the constraint on the attachment surface of the light emitting device as the display device or the display lamp, resulting in improved convenience and availability of the transparent light emitting device.

The transparent light emitting device has a structure in which a plurality of LED chips are arranged, for example, between a first transparent insulating substrate having a first conductive circuit layer and a second transparent insulating substrate having a second conductive circuit layer. Each of the plurality of LED chips has a pair of electrodes. One of the electrodes is electrically connected to the first conductive circuit layer, and the other electrode is electrically connected to the second conductive circuit layer. The plural LED chips are arranged with a certain interval therebetween. In a space between the first and second transparent insulating substrates occurring based on the arrangement interval between the plural LED chips, a transparent insulator made of a transparent resin or the like having electric insulation property and flexibility is filled. In other words, the LED chips are arranged in through holes provided in the transparent insulator.

The electrical connection between the electrodes of the LED chips and the conductive circuit layers in the transparent light emitting device is sometimes made, for example, by vacuum thermocompression bonding a stack composed of the first transparent insulating substrate, a transparent insulating resin sheet in which the LED chips are arranged in the through holes, and the second transparent insulating substrate. The electrodes of the LED chips and the conductive circuit layers are sometimes bonded with each other with a conductive adhesive. It is also under discussion that thermocompression bonding is performed with a hot melt adhesive sheet, to which the LED chips are fixed, sandwiched between upper and lower insulating substrates having the conductive circuit layers to embed the LED chips in the adhesive sheet, thereby performing the bonding of the upper and lower insulating substrates and the electrical connection between the electrodes of the LED chips and the conductive circuit layers at the same time.

However, it is impossible, in any case, to sufficiently increase the electrical connection between the electrodes of the LED chips and the conductive circuit layers and its reliability. For example, it is under discussion that, in the case of vacuum thermocompression bonding the stack composed of the first transparent insulating substrate, the transparent insulating resin sheet, and the second transparent insulating substrate, the thickness of the transparent insulating resin sheet after the thermocompression bonding (the thickness of the transparent insulator) is made smaller than the thickness of the LED chip to press the conductive circuit layers against the electrodes of the LED chips so as to bring them into contact. However, depending on the material and the thickness of the transparent insulator or the arrangement interval of the LED chips, it is impossible to reliably electrically connect the electrodes and the conductive circuit layers. Hence, a technique that increases the electrical connection between the conductive circuit layers and the electrodes of the LED chips and its reliability with high reproducibility, is required.

DETAILED DESCRIPTION OF THE INVENTION

Figure 1:
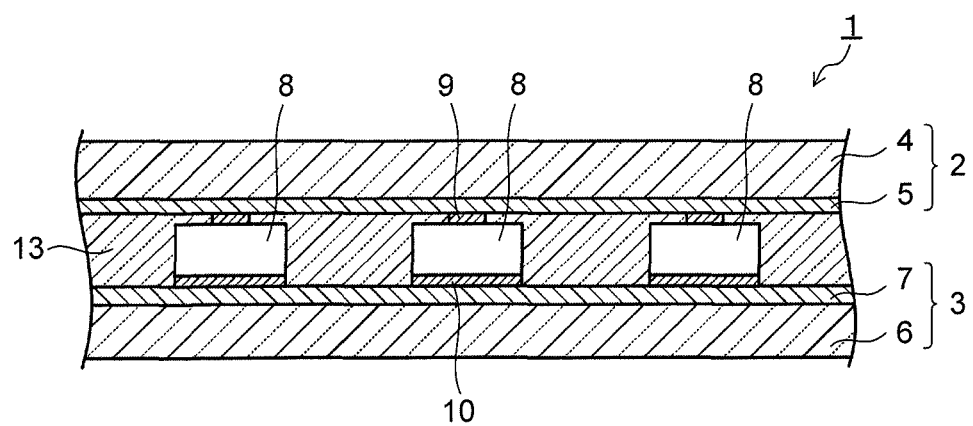
FIG. 1 is a cross-sectional view illustrating a light emitting device according to a first embodiment.

A light emitting device in an embodiment includes: a first light transmissive support including a first light transmissive insulator; a second light transmissive support including a second light transmissive insulator; a conductive circuit layer provided on at least one of a first surface of the first light transmissive insulator and a second surface of the second light transmissive insulator opposed to the first surface; a light emitting diode including: a light emitting diode body having a first face and a second face; a first electrode provided on the first face of the light emitting diode body and electrically connected to the conductive circuit layer; and a second electrode provided on the first face or the second face of the light emitting diode body and electrically connected to the conductive circuit layer, and arranged between the first light transmissive insulator and the second light transmissive insulator; and a third light transmissive insulator embedded between the first light transmissive insulator and the second light transmissive insulator and having at least one of a Vicat softening temperature of 80° C. or higher and 160° C. or lower and a tensile storage elastic modulus of 0.01 GPa or more and 10 GPa or less.

A method for manufacturing a light emitting device in an embodiment includes: preparing a first light transmissive support including a first light transmissive insulator, and a second light transmissive support including a second light transmissive insulator; forming a conductive circuit layer on at least one of a first surface of the first light transmissive insulator and a second surface of the second light transmissive insulator; preparing a light emitting diode including a light emitting diode body having a first face and a second face, a first electrode provided on the first face of the light emitting diode body, and a second electrode provided on the first face or the second face of the light emitting diode body; arranging a light transmissive insulating resin sheet having at least one of a Vicat softening temperature of 80° C. or higher and 160° C. or lower and a tensile storage elastic modulus of 0.01 GPa or more and 10 GPa or less on the surface, on which the conductive circuit layer is provided, of the first surface of the first light transmissive insulator and the second surface of the second light transmissive insulator; arranging the light emitting diode between the first surface of the first light transmissive insulator and the second surface of the second light transmissive insulator via the light transmissive insulating resin sheet; and pressurizing a stack including the first light transmissive insulator, the light transmissive insulating resin sheet, the light emitting diode, and the second light transmissive insulator, while heating the stack in a vacuum atmosphere, to embed the light transmissive insulating resin sheet between the first light transmissive insulator and the second light transmissive insulator to thereby form a third light transmissive insulator, while electrically connecting the first and second electrodes and the conductive circuit layer.

Hereinafter, a light emitting device and a method for manufacturing the same in embodiments will be described referring to the drawings.

First Embodiment

FIG. 1 is a cross-sectional view illustrating a configuration of a light emitting device according to a first embodiment. A light emitting device 1 illustrated in FIG. 1 includes a first light transmissive support 2 and a second light transmissive support 3. The first light transmissive support 2 includes a first light transmissive insulator 4 and a first conductive circuit layer 5 formed on the surface of the first light transmissive insulator 4. The second light transmissive support 3 includes a second light transmissive insulator 6 and a second conductive circuit layer 7 formed on the surface of the second light transmissive insulator 6. The first light transmissive support 2 and the second light transmissive support 3 are arranged with a predetermined gap provided therebetween such that the first conductive circuit layer 5 and the second conductive circuit layer 7 are opposed to each other. In the gap between the first light transmissive support 2 and the second light transmissive support 3, a plurality of light emitting diodes 8 are arranged.

For the light transmissive insulators 4, 6, for example, a resin material having an insulation property and a light transmitting property is used, and a resin material further having flexibility is preferably used. Examples of such an insulating resin material include polyethylene terephthalate (PET), polyethylene naphthalate (PEN), polycarbonate (PC), polyethylene succinate (PES), cyclic olefin resin (for example, ARTON (brand name) manufactured by JSR Corporation), acrylic resin and so on. The total light transmittances (JIS K7105) of the light transmissive insulators 4, 6 are preferably 90% or more, and more preferably 95% or more. The thicknesses of the light transmissive insulators 4, 6 are preferably in a range of 50 to 300 μm. If the thicknesses of the light transmissive insulators 4, 6 are too large, there is a possibility that imparting excellent flexibility to the light transmissive supports 2, 3 becomes difficult and the light transmitting property also decreases.

The light transmissive insulators 4, 6 are not limited to insulating resin bodies (sheets or the like) having the light transmitting property but may be made of, for example, an inorganic material having both the insulation property and the light transmitting property such as, for example, glass. However, in the case of using glass substrates as the light transmissive insulators 4, 6, it is impossible to impart the flexibility to the first and second light transmissive supports 2, 3. In the case of imparting the flexibility to the light transmissive supports 2, 3 and the light emitting device 1 using them, it is preferable to use light transmissive insulators 4, 6 composed of insulating resin bodies having the light transmitting property and the flexibility. One of the first and second light transmissive insulators 4, 6 may be composed of a material having the flexibility such as the insulating resin body and the other may be composed of a rigid material such as the glass substrate.

On the surface of the first light transmissive insulator 4, the first conductive circuit layer 5 is formed. Similarly, on the surface of the second light transmissive insulator 6, the second conductive circuit layer 7 is formed. For the conductive circuit layers 5, 7, for example, a transparent conductive material such as indium tin oxide (ITO), fluorine-doped tin oxide (FTO), zinc oxide, indium zinc oxide (IZO) or the like is used. Examples of the conductive circuit layers 5, 7 made of the transparent conductive material include those made by applying the sputtering method, the electron beam evaporation method or the like to form a thin film and patterning the obtained thin film through laser beam machining, etching treatment or the like to form a circuit. The conductive circuit layers 5, 7 may be those made by applying a mixture of fine particles (for example, fine particles having an average particle size in a range of 10 to 100 nm) of the transparent conductive material and a transparent resin binder into a circuit shape by the screen printing or the like, or those made by performing patterning processing by the laser beam machining or photolithography to a coating film of the aforementioned mixture to form a circuit.

The conductive circuit layers 5, 7 are not limited to those made of the transparent conductive material but may be those made by attaching fine particles of an opaque conductive material such as gold, silver or the like in a mesh form. For example, the conductive circuit layers 5, 7 in the mesh form are formed by applying a photosensitive compound of the opaque conductive material such as silver halide and then performing exposure and developing treatments thereon. The conductive circuit layers 5, 7 may be formed by applying slurry containing opaque conductive material fine particles by the screen printing or the like in the mesh formed. The conductive circuit layers 5, 7 only need to be those that exhibit the light transmitting property when they are formed on the surfaces of the light transmissive insulators 4, 6 and provide the light transmissive supports 2, 3. The conductive circuit layers 5, 7 preferably have light transmitting properties so that the total light transmittances (JIS K7105) of the light transmissive supports 2, 3 are 10% or more and the total light transmittance as the whole light emitting device 1 is 1% or more. If the total light transmittance as the whole light emitting device 1 is less than 1%, the light emitting point is not recognized as a luminescent spot any longer. The light transmitting properties of the conductive circuit layers 5, 7 themselves differ depending on their configurations, but the total light transmittances are preferably in a range of 10 to 85%. If the total light transmittances of both of the conductive circuit layers 5, 7 exceed 85%, a wiring pattern becomes easily recognizable by the naked eyes, resulting in inconvenience as the light emitting device 1.

Between the surface having the first conductive circuit layer 5 of the first light transmissive support 2 and the surface having the second conductive circuit layer 7 of the second light transmissive support 3, the plurality of light emitting diodes 8 are arranged. As the light emitting diode, a diode chip having a PN junction (hereinafter, written as an LED chip 8) is generally used. Note that the light emitting diode used herein is not limited to the LED chip 8 but may be a laser diode (LD) chip or the like. As the LED chip 8, for example, the one in which a P-type semiconductor layer is formed on an N-type semiconductor substrate, the one in which an N-type semiconductor layer is formed on a P-type semiconductor substrate, the one in which an N-type semiconductor layer and a P-type semiconductor layer are formed on a semiconductor substrate, the one in which a P-type hetero semiconductor layer and an N-type hetero semiconductor layer are formed on a P-type semiconductor substrate, the one in which an N-type hetero semiconductor layer and a P-type hetero semiconductor layer are formed on an N-type semiconductor substrate, and so on are known, and in any of them, electrodes 9, 10 are provided on both the upper and lower surfaces of the LED chip 8.

Figure 2:
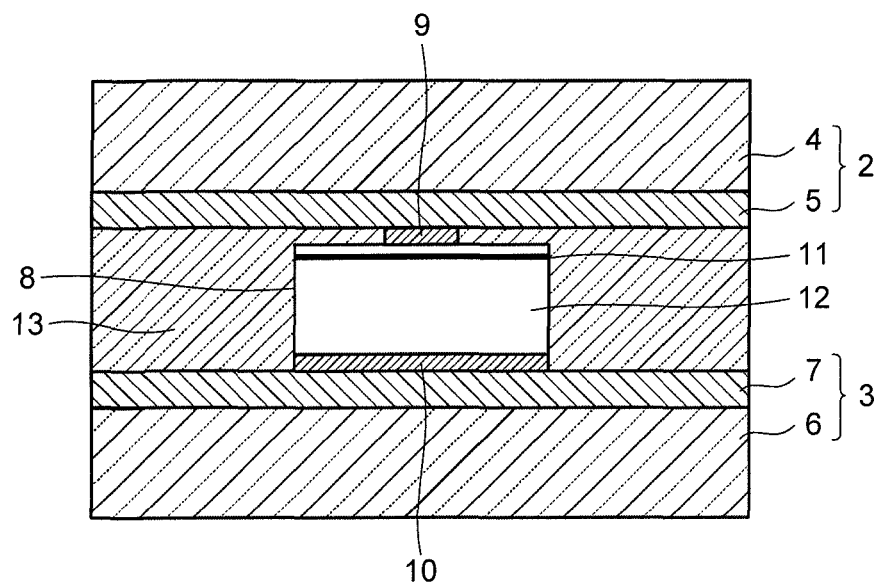
FIG. 2 is a cross-sectional view illustrating the light emitting device illustrated in FIG. 1 with a part thereof enlarged.
Figure 3:
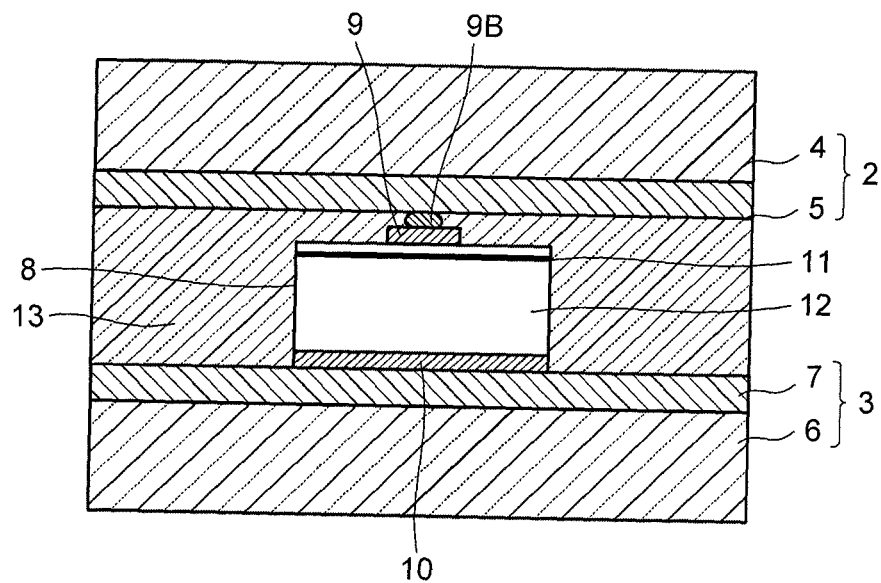
FIG. 3 is a cross-sectional view illustrating a modified example of the light emitting device illustrated in FIG. 1 with a part thereof enlarged.

The LED chip 8 used in the first embodiment includes, as illustrated in FIG. 2: a chip body (light emitting diode body) 12 having an active layer (a PN junction interface, a semiconductor layer being a light emitting region of a double heterojunction structure or the like) 11; the first electrode 9 provided on a first face close to the active layer 11 of the chip body 12; and the second electrode 10 provided on a second face far from the active layer 11 of the chip body 12. Here, for convenience, the first face close to the active layer 11 is written as a light emitting surface and the second face far from the active layer 11 is written as a non-light emitting surface in some cases but not limited to this. Depending on the constituent materials of the second conductive circuit layer 7, the chip body 12 and the like, both of the faces can be made light emitting surfaces. The first electrode 9 is in direct contact with the first conductive circuit layer 5 and thereby electrically connected thereto, and the second electrode 10 is in direct contact with the second conductive circuit layer 7 and thereby electrically connected thereto. The first conductive circuit layer 5 and the first electrode 9 may be electrically connected with each other via a bump electrode 9B provided on the first electrode 9 as illustrated in FIG. 3. The bump electrode 9B can be formed by pressing a ball which is formed at the tip of a conductive wire such as a gold wire against the first electrode 9 and then cutting the wire. The LED chip 8 lights up by the DC voltage applied thereto via the first and second electrodes 9, 10.

The first electrode 9 provided on the light emitting surface of the chip body 12 has an area smaller than that of the light emitting surface so as not to hinder light emission from the active layer 11 from being released to the outside. The light emitting surface of the chip body 12 has a forming surface and a non-forming surface of the first electrode 9. Further, the first electrode 9 has a shape projecting from the light emitting surface, for example, a shape projecting 0.1 μm or more. The second electrode 10 is provided on the entire non-light emitting surface of the chip body 12. The surface (a contact surface with the second conductive circuit layer 7) of the second electrode 10 preferably has, for example, a projecting and recessed shape of 1 μm or more in order to increase the electrical connection reliability with the second conductive circuit layer 7, and more preferably has a shape with repeated fine projections and recesses. The surface (a contact surface with the first conductive circuit layer 5) of the first electrode 9 also preferably has the same projecting and recessed shape. Note that on the surface of the electrode of an ordinary LED chip, a projecting and recessed shape is sometimes formed in addition to that for improving the electrical connection reliability.

In a portion except arrangement portions of the plurality of LED chips 8 between the first light transmissive support 2 and the second light transmissive support 3, a third light transmissive insulator 13 is embedded which has at least one of a Vicat softening temperature of 80 to 160° C. and a tensile storage elastic modulus of 0.01 to 10 GPa. The third light transmissive insulator 13 preferably has both the above-described Vicat softening temperature and tensile storage elastic modulus. The tensile storage elastic modulus here indicates a value between 0° C. and 100° C. It is further preferable that the third light transmissive insulator 13 does not melt at the Vicat softening temperature and has a tensile storage elastic modulus at the Vicat softening temperature of 0.1 MPa or more. The third light transmissive insulator 13 preferably has a melting temperature of 180° C. or higher, or a melting temperature higher by 40° C. or more than the Vicat softening temperature. In addition, the third light transmissive insulator 13 preferably has a glass transition temperature of −20° C. or lower.

The Vicat softening temperature is a value obtained under the conditions of a test load of 10 N and a rate of heating of 50° C./hour and under A50 condition described in JIS K7206 (ISO 306: 2004). The glass transition temperature and the melting temperature are values obtained by the method complying with JIS K7121 (ISO 3146), using a differential scanning calorimeter, at a rate of heating of 5° C./min, by heat flux differential scanning calorimetry. The tensile storage elastic modulus is a value obtained complying with JIS K7244-1 (ISO 6721), using a dynamic viscoelasticity automatic measuring device, at a rate of uniform heating of 1° C./min from −100° C. to 200° C., and at a frequency of 10 Hz.

The third light transmissive insulator 13 is preferably composed of a light transmissive insulating resin satisfying characteristics such as the above-described Vicat softening temperature, tensile storage elastic modulus, melting temperature, glass transition temperature and so on, in particular, an elastomer. The elastomer is an elastic body of a polymeric material. As the elastomer, an acryl-based elastomer, an olefin-based elastomer, a styrene-based elastomer, an ester-based elastomer, an urethane-based elastomer and so on are known. The acryl-based elastomer satisfying the above-described characteristics is excellent in flowability when softened, adhesiveness after curing, weather resistance and so on in addition to light transmitting property, electric insulation property, flexibility and so on, and is thus suitable as the constituent material of the third light transmissive insulator 13. Further, the elastomer as the constituent material of the third light transmissive insulator 13 more preferably has a peeling strength (by the method A of JIS C5061 8.1.6) of the third light transmissive insulator 13 formed using the elastomer with respect to the conductive circuit layers 5, 7 of 0.49 N/mm or more. The third light transmissive insulator 13 only needs to be the one containing the above-described elastomer as a main component, and may contain other resin component, filler, additive and so on as necessary.

Use of the elastomer or the like having the above-described Vicat softening temperature, tensile storage elastic modulus, and melting temperature makes it possible to embed the third light transmissive insulator 13 in close contact with the plurality of LED chips 8, between the first light transmissive support 2 and the second light transmissive support 3 while successfully maintaining the electrical connection between the conductive circuit layers 5, 7 and the electrodes 9, 10 of the plurality of LED chips 8. In other words, the contact state between the conductive circuit layers 5, 7 and the electrodes 9, 10 is maintained by the third light transmissive insulator 13 arranged in close contact with the peripheries of the LED chips 8. Accordingly, the electrical connection reliability between the conductive circuit layers 5, 7 and the electrodes 9, 10 of the LED chips 8, in particular, the electrical connection reliability between the conductive circuit layers 5, 7 and the electrodes 9, 10 when a bending test and a thermal cycle test (TCT) are performed on the light emitting device 1, can be increased.

For example, as described in the aforementioned Patent References 3, 4, when electrical connection is made simply by pressing the conductive circuit layers against the electrode of the LED chips on the basis of the thickness of the third light transmissive insulator to be filled between the first and second light transmissive insulators, the electrical connection between the conductive circuit layers and the electrodes cannot be sufficiently increased. In particular, when the light emitting device is greatly bent or subjected to the thermal cycle test, the electrical connection reliability between conductive circuit layers and the electrodes is likely to decrease. Further, as described in the aforementioned Patent References 3, 4, when the electrodes of the LED chips and the conductive circuit layers are bonded together with a conductive adhesive, it is difficult to sufficiently insulate the plurality of LED chips from one another and therefore cause complication of a connection process, an increase in man-hour and so on, resulting in that the manufacturing cost is likely to increase. The light emitting device 1 in this embodiment has been improved in the drawbacks of the conventional devices.

If the Vicat softening temperature of the third light transmissive insulator 13 exceeds 160° C., the light transmissive insulating resin sheets cannot be sufficiently deformed in a later-described formation process of the third light transmissive insulator 13, whereby the electrical connection between the conductive circuit layers 5, 7 and the electrodes 9, 10 decreases. If the Vicat softening temperature of the third light transmissive insulator 13 is below 80° C., the power for holding the LED chips 8 is insufficient, whereby the electrical connection reliability between the conductive circuit layers 5, 7 and the electrodes 9, 10 decreases. The Vicat softening temperature of the third light transmissive insulator 13 is more preferably 100° C. or higher. The electrical connection reliability between the conductive circuit layers 5, 7 and the electrodes 9, 10 can be further increased. The Vicat softening temperature of the third light transmissive insulator 13 is furthermore preferably 140° C. or lower. The electrical connection between the conductive circuit layers 5, 7 and the electrodes 9, 10 can be effectively increased.

Also when the tensile storage elastic modulus of the third light transmissive insulator 13 is less than 0.01 GPa, the electrical connection between the conductive circuit layers 5, 7 and the electrodes 9, 10 decreases. The LED chip 8 and its electrodes 9, 10 are minute, so that in order to accurately connect the electrodes 9, 10 of the plurality of LED chips 8 to predetermined positions on the conductive circuit layers 5, 7 in later-described vacuum thermocompression bonding, the light transmissive insulating resin sheets need to maintain relatively high storage elastic properties from room temperature to near the heating temperature of the vacuum thermocompression bonding process. If the elasticity of the resin decreases in the vacuum thermocompression bonding, inclination or little movement in the lateral direction of the LED chips 8 occurs during processing, leading to failure to electrically connect the electrodes 9, 10 and the conductive circuit layers 5, 7 or easily causing an event such as an increase in connection resistance. This becomes a factor that decreases the manufacturing yield or the reliability of the light emitting device 1. To prevent this, it is preferable to apply the third light transmissive insulator 13 having a tensile storage elastic modulus of 0.01 GPa or more. However, if the storage elastic properties are too high, the bending resistance and so on of the light emitting device 1 decrease, and therefore it is preferable to apply the third light transmissive insulator 13 having a tensile storage elastic modulus of 10 GPa or less. The tensile storage elastic modulus between 0° C. and 100° C. of the third light transmissive insulator 13 is more preferably 0.1 GPa or more, and furthermore preferably 7 GPa or less.

When the elastomer or the like constituting the third light transmissive insulator 13 does not melt at the Vicat softening temperature and has a tensile storage elastic modulus at the Vicat softening temperature of 0.1 MPa or more, the accuracy of position between the electrodes 9, 10 and the conductive circuit layers 5, 7 in the vacuum thermocompression bonding can be further increased. From these points, the elastomer constituting the third light transmissive insulator 13 preferably has a melting temperature of 180° C. or higher, or a melting temperature higher by 40° C. or more than the Vicat softening temperature. The tensile storage elastic modulus at the Vicat softening temperature of the elastomer is more preferably 1 MPa or more. Further, the melting temperature of the elastomer is more preferably 200° C. or higher, or higher by 60° C. or more than the Vicat softening temperature.

For example, a hot melt adhesive sheet described in the aforementioned Patent Reference 2 is thermally melted to be fluidized and brought into close contact with an adherend and then cooled and solidified to exhibit an adhesive force, and is an adhesive that controls fluidization and solidification by heat. The hot melt adhesive is usually melted at a processing temperature. A melt at the processing temperature or a viscous body having a tensile storage elastic modulus of less than 0.1 MPa though not melted, is difficult to maintain the positions and the inclinations of the LED chips disposed on the hot melt adhesive sheet in a predetermined state up to the processing temperature. Therefore, it is difficult to maintain the positions and the inclinations of the LED chips in a predetermined state and difficult to mount the LED chips in a predetermined state at designed places. The light emitting device 1 in this embodiment has been improved in the drawbacks of the conventional device.

Further, in order that the third light transmissive insulator 13 improves not only the manufacturability of the light emitting device 1 but also the bending resistance and the thermal cycle resistance characteristics of the light emitting device 1 in a wide temperature range from low temperature to high temperature, the characteristic balance among the above-described Vicat softening temperature, tensile storage elastic modulus, and glass transition temperature is important. Use of the elastomer having the above-described tensile storage elastic modulus makes it possible to increase the bending resistance and the thermal cycle resistance characteristics of the light emitting device 1. However, depending on the outdoor application or the living environment during winter even in the indoor, the bending resistance and the thermal cycle resistance characteristics at low temperature are required. If the glass transition temperature of the elastomer is too high, the bending resistance and the thermal cycle resistance characteristics of the light emitting device 1 in a low temperature environment may decrease. Therefore, it is preferable to use an elastomer having a glass transition temperature of −20° C. or lower. Based on such glass transition temperature and tensile storage elastic modulus, the bending resistance and the thermal cycle resistance characteristics in a wide temperature range from low temperature to high temperature of the light emitting device 1 can be improved. The glass transition temperature of the elastomer is more preferably −40° C. or lower.

The thickness of the third light transmissive insulator 13 may be equal to the gap between the first light transmissive support 2 and the second light transmissive support 3 based on the height (the height from the surface of the first electrode 9 to the surface of the second electrode 10) of the LED chip 8, but is preferably smaller than the height of the LED chip 8 in order to increase the contact property between the conductive circuit layers 5, 7 and the electrodes 9, 10. Further, a thickness (T) of the third light transmissive insulator 13 is preferably set so that a difference (H−T) from a height (H) of the LED chip 8 falls within a range of 5 to 200 μm. However, if the thickness (T) of the third light transmissive insulator 13 is made too small, maintenance of the shape of the third light transmissive insulator 13 may become difficult or the adhesiveness to the LED chip 8 or the like may decrease. Therefore, the difference (H−T) between the height (H) of the LED chip 8 and the thickness (T) of the third light transmissive insulator 13 is preferably set to ½ or less of the height (H) of the LED chip 8. Note that in the case where the bump electrode 9A is provided on the first electrode 9, the height (H) of the LED chip 8 is assumed to indicate the height from the top portion of the bump electrode 9A to the surface of the second electrode 10.

Further, use of the resin having the above-described Vicat softening temperature, tensile storage elastic modulus, and melting temperature makes it possible to arrange the third light transmissive insulator 13 also at the periphery of the first electrode 9. In more detail, in the case where the first electrode 9 has the area smaller than that of the light emitting surface of the chip body 12 and the shape projecting from the light emitting surface, a space is generated between the surface (the non-forming surface of the first electrode 9) where the first electrode 9 is not formed within the light emitting surface and the first conductive circuit layer 5 in the state that the first electrode 9 is in contact with the first conductive circuit layer 5. The resin having the above-described Vicat softening temperature, tensile storage elastic modulus, and melting temperature makes it possible to successfully fill a part of the third light transmissive insulator 13 in the space between the non-forming surface of the first electrode 9 and the first conductive circuit layer 5.

Figure 4:
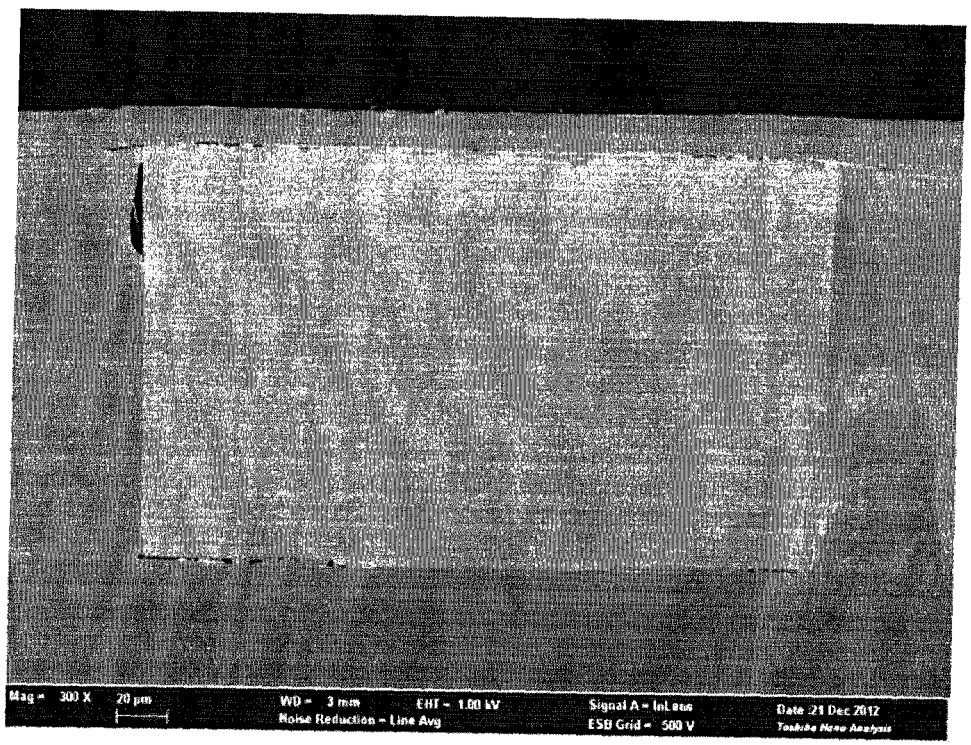
FIG. 4 is a SEM image indicating the light emitting device according to the first embodiment with a part thereof enlarged.

FIG. 4 is an enlarged SEM image indicating the LED chip 8 and its surroundings in the light emitting device 1. As is clear from FIG. 4, a part of the third light transmissive insulator 13 is filled between the non-forming surface of the first electrode 9 within the light emitting surface of the chip body 12 and the conductive circuit layer 5. As described above, a part of the third light transmissive insulator 13 is filled between the light emitting surface of the chip body 12 and the conductive circuit layer 5 so that the part of the third light transmissive insulator 13 exists in close contact with the periphery of the first electrode 9, whereby the third light transmissive insulator 13 can successfully maintain the contact state between the electrode 9 and the conductive circuit layer 5. In other words, even when the light emitting device 1 is bent, the contact state between the electrode 9 and the conductive circuit layer 5 is successfully maintained. Accordingly, it becomes possible to increase the electrical connection reliability between the first conductive circuit layer 5 and the first electrode 9 of the LED chips 8 with higher reproducibility.

As for the contact structure between the second conductive circuit layer 7 and the second electrode 10 of the LED chip 8, the third light transmissive insulator 13 exists in close contact with the periphery of the second electrode 10, so that the contact state is successfully maintained. Further, when the surface of the second electrode 10 has the projecting and recessed shape, the projections in the projecting and recessed shape can be brought into direct contact with the conductive circuit layer 7 to form electrical connection regions, and the third light transmissive insulator 13 can be filled in the recesses in the projecting and recessed shape to form mechanical coupling regions. More specifically, as indicated in FIG. 4, the electrical connection regions where the conductive circuit layer 7 and the electrode 10 are in direct contact with each other and the mechanical coupling regions where the part of the third light transmissive insulator 13 intervenes between the conductive circuit layer 7 and the electrode 10, are formed on the contact interface between the conductive circuit layer 7 and the electrode 10. This can increase the mechanical coupling property while maintaining the electrical connection between the conductive circuit layer 7 and the electrode 10. In other words, it becomes possible to increase the electrical connection reliability between the second conductive circuit layer 7 and the second electrode 10 of the LED chip 8 with higher reproducibility.

The contact interface having the above-described electrical connection regions and mechanical coupling regions is effective not only to the contact portion between the second conductive circuit layer 7 and the second electrode 10 but also to the contact portion between the first conductive circuit layer 5 and the first electrode 9. The contact interfaces having the electrical connection regions and the mechanical coupling regions can be obtained not only when the surfaces of the electrodes 9, 10 have the projecting and recessed shapes but also when they have relatively flat surfaces, by using the resin having the above-described Vicat softening temperature, tensile storage elastic modulus, and melting temperature and controlling the vacuum thermocompression bonding condition and the like of the later-described resin sheets. In short, controlling the drawn state and the like of the resin in the vacuum thermocompression bonding of the resin sheets makes it possible to obtain the contact interfaces between the conductive circuit layers 5, 7 and the electrodes 9, 10 having the electrical connection regions and the mechanical coupling regions. This can further increase the electrical connection reliability between the conductive circuit layers 5, 7 and the electrodes 9, 10.

Next, a method for manufacturing the light emitting device 1 in the first embodiment will be described referring to FIGS. 5A to 5E. First, the first light transmissive support 2 having the first light transmissive insulator 4 and the first conductive circuit layer 5 formed on the surface of the first light transmissive insulator 4, and the second light transmissive support 3 having the second light transmissive insulator 6 and the second conductive circuit layer 7 formed on the surface of the second light transmissive insulator 6, are prepared. The constituent material and the forming method and so on of the conductive circuit layers 5, 7 are as described above. Then, first and second light transmissive insulating resin sheets 14, 15 having a Vicat softening temperature in a range of 80 to 160° C. are prepared. The light transmissive insulating resin sheets 14, 15 preferably use, as a main component, a resin that has the above-described Vicat softening temperature, and additionally, does not melt at the Vicat softening temperature at a tensile storage elastic modulus between 0° C. and 100° C. in a range of 0.01 to 10 GPa, has a tensile storage elastic modulus at the Vicat softening temperature of 0.1 MPa or more, a melting temperature of 180° C. or higher or higher by 40° C. or more than the Vicat softening temperature, and a glass transition temperature of −20° C. or lower. The light transmissive insulating resin sheets 14, 15 are preferably elastomer sheets, and more preferably acryl-based elastomer sheets.

Figure 5A:
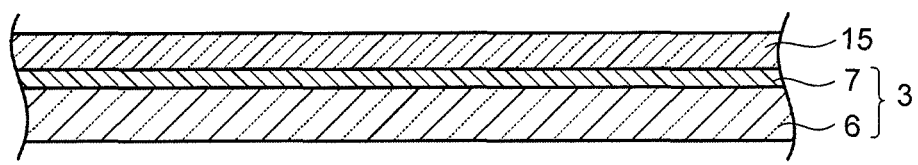
FIG. 5A to FIG. 5E are a cross-sectional view illustrating manufacturing processes of the light emitting device according to the first embodiment.
Figure 5B:
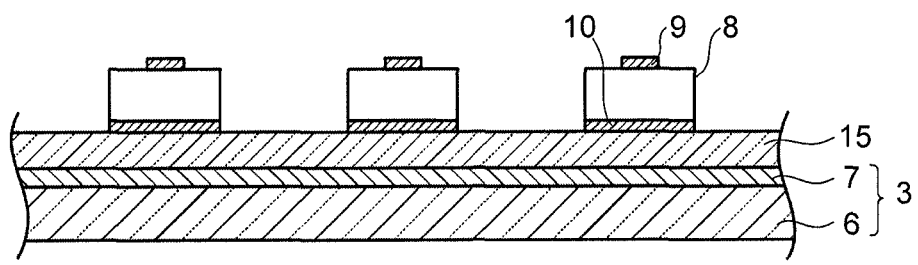
Figure 5C:
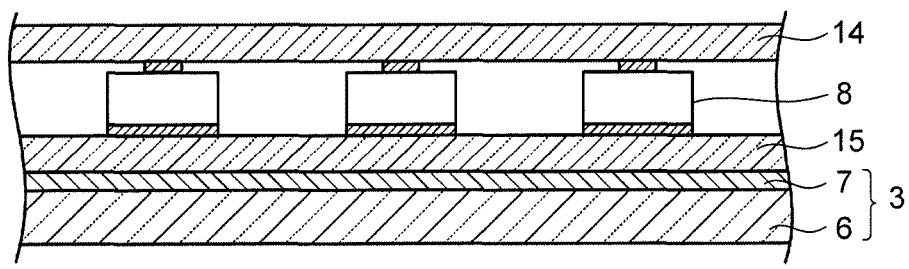
Figure 5D:
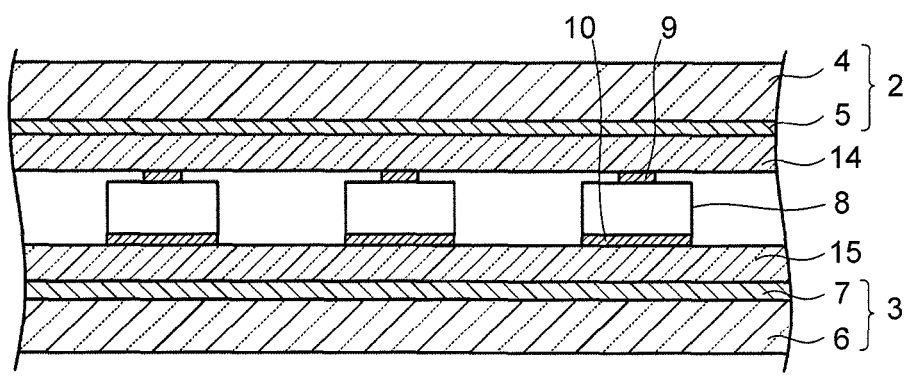

On the second conductive circuit layer 7 of the second light transmissive support 3, the second light transmissive insulating resin sheet 15 is disposed to cover the entire second conductive circuit layer 7 (FIG. 5A). The second light transmissive insulating resin sheet 15 has a shape capable of covering the entire conductive circuit layer 7 including portions that become arrangement positions of the LED chips 8 on the conductive circuit layer 7, and the entire light transmissive insulator 6. On the second light transmissive insulating resin sheet 15, the plurality of LED chips 8 are arranged (FIG. 5B). The LED chips 8 are disposed such that the second electrodes 10 are located on the second light transmissive insulating resin sheet 15 side, in other words, located on the second conductive circuit layer 7 side. Further, on the LED chips 8, the first light transmissive insulating resin sheet 14 is disposed (FIG. 5C), and the first light transmissive support 2 is disposed thereon (FIG. 5D).

The first light transmissive support 2 is disposed such that the first conductive circuit layer 5 faces the first light transmissive insulating resin sheet 14. The first light transmissive insulating resin sheet 14 has a shape capable of covering the entire conductive circuit layer 5 including portions that become the arrangement positions of the LED chips 8 on the conductive circuit layer 5, and further the entire light transmissive insulator 4. Accordingly, on the first light transmissive support 2 disposed on the first light transmissive insulating resin sheet 14, the entire first conductive circuit layer 5 is covered with the first light transmissive insulating resin sheet 14. By performing the processes illustrated in FIGS. 5A to 5D, the LED chips 8 are arranged between the first light transmissive insulating resin sheet 14 and the second light transmissive insulating resin sheet 15 such that the first electrodes 9 are located on the first light transmissive insulating resin sheet 14 side and the second electrodes 10 are located on the second light transmissive insulating resin sheet 15 side.

The first and second light transmissive insulating resin sheets 14, 15 only need to have thicknesses capable of sufficiently filling the space between the first light transmissive support 2 and the second light transmissive support 3, namely, the space based on the gap between the first light transmissive support 2 and the second light transmissive support 3 generated by arranging the LED chips 8 in the vacuum thermocompression bonding process illustrated below. Specifically, the total thickness of the first and second light transmissive insulating resin sheets 14, 15 only needs to be able to sufficiently fill the gap between the first light transmissive support 2 and the second light transmissive support 3 based on the above-described height of the LED chip 8. When making the thickness (T) of the third light transmissive insulator 13 smaller than the height (H) of the LED chip 8, it is only necessary to set the total thickness of the first and second light transmissive insulating resin sheets 14, 15, corresponding to the difference (H−T) between them.

Figure 5E:
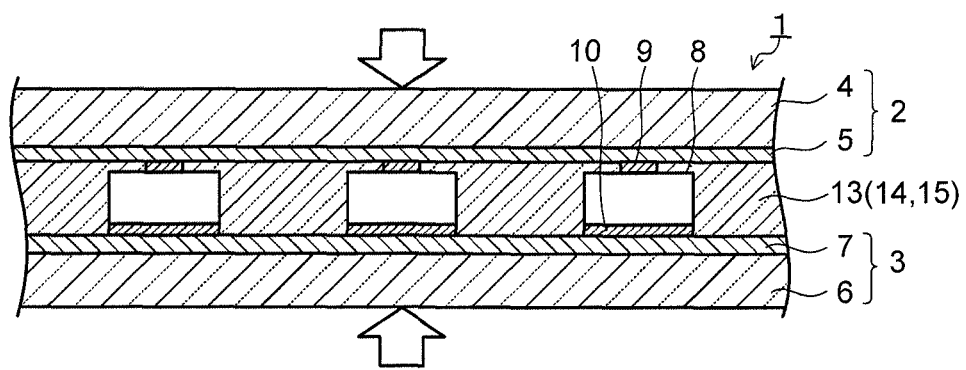

Then, as illustrated in FIG. 5E, a stack in which the second light transmissive support 3, the second light transmissive insulating resin sheet 15, the LED chips 8, the first light transmissive insulating resin sheet 14, and the first light transmissive support 2 are stacked in order is pressurized while being heated in a vacuum atmosphere. A heating and pressurizing process (vacuum thermocompression bonding process) in the vacuum atmosphere for the stack is preferably performed by pressurizing the stack while heating it to a temperature T of Mp−10 (° C.)≤T≤Mp+30 (° C.) with respect to a Vicat softening temperature Mp (° C.) of the light transmissive insulating resin sheets 14, 15. The heating temperature is more preferably Mp−10 (° C.)≤T≤Mp+20 (° C.), and furthermore preferably Mp−10 (° C.)≤T≤Mp+10 (° C.).

Applying such heating conditions makes it possible to pressurize the stack in a state that the light transmissive insulating resin sheets 14, 15 are moderately softened. Accordingly, it is possible to, while connecting the first electrodes 9 disposed on the conductive circuit layer 5 via the light transmissive insulating resin sheet 14 to predetermined positions on the first conductive circuit layer 5 and connecting the second electrodes 10 disposed on the conductive circuit layer 7 via the light transmissive insulating resin sheet 15 to predetermined positions on the second conductive circuit layer 7, embed the softened light transmissive insulating resin sheets 14, 15 between the first light transmissive support 2 and the second light transmissive support 3 to form the third light transmissive insulator 13.

If the heating temperature T in the vacuum thermocompression bonding of the stack is below a temperature lower than by 10 (° C.) than the Vicat softening temperature Mp of the light transmissive insulating resin sheets 14, 15 (T<Mp−10), there is a possibility that the softening of the light transmissive insulating resin sheets 14, 15 becomes insufficient, so that the adhesiveness of the light transmissive insulating resin sheets 14, 15 (accordingly, the third light transmissive insulator 13) to the LED chip 8 decreases. Further, there is a possibility that a part of the light transmissive insulating resin sheets 14, 15 (accordingly, the third light transmissive insulator 13) cannot be successfully filled in the space between the non-forming surface of the first electrode 9 within the light emitting surface of the chip body 12 and the first conductive circuit layer 5. If the heating temperature T exceeds a temperature higher by 30 (° C.) than the Vicat softening temperature Mp of the light transmissive insulating resin sheets 14, 15 (Mp+30<T), there is a possibility that the light transmissive insulating resin sheets 14, 15 are softened too much to cause a defective shape or the like.

The tensile storage elastic modulus at the Vicat softening temperature of the elastomer used for the light transmissive insulating resin sheets 14, 15 is preferably 0.1 MPa or more, and more preferably, 1 MPa or more, for example, 1 MPa to 1 GPa. The tensile storage elastic modulus at the thermocompression bonding temperature of the elastomer used for the light transmissive insulating resin sheets 14, 15 is preferably 0.1 MPa or more, and more preferably, 1 MPa or more, for example, 1 MPa to 1 GPa. The tensile storage elastic modulus, for example, in a temperature range of higher than 100° C. and 170° C. or lower of the elastomer used for the light transmissive insulating resin sheets 14, 15 is preferably 0.1 MPa or more, for example, 1 MPa to 1 GPa. However, it is preferable to set the thermocompression bonding temperature to be able to assure a value of a tensile storage elastic modulus at the thermocompression bonding temperature of 1 MPa or more. Note that the preferable ranges of the tensile storage elastic modulus at the Vicat softening temperature, at the thermocompression bonding temperature, and in the temperature range of higher than 100° C. and 170° C. or lower also apply to other embodiments as with other parameters.

The thermocompression bonding process in the vacuum atmosphere for the stack is preferably performed as follows. Preliminarily pressurization is performed on the above-described stack to bring its components into close contact with one another. Then, a working space in which the preliminarily pressurized stack is placed is evacuated, and then pressurization is performed on the stack while heating it to the above-described temperature. Thermocompression bonding the preliminarily pressurized stack in the vacuum atmosphere as described above makes it possible to embed the softened light transmissive insulating resin sheets 14, 15 in the space between the first light transmissive support 2 and the second light transmissive support 3 without any gap therebetween. The vacuum atmosphere in the thermocompression bonding is preferably 5 Pa or less. The preliminarily pressurization process can be omitted, but in this case, positional displacement or the like becomes likely to occur in the stack, and therefore it is preferable to perform the preliminarily pressurization process.

When the thermocompression bonding process for the stack is performed under the air atmosphere or a low vacuum, bubbles are likely to remain in the light emitting device 1 after the thermocompression bonding, in particular, around the LED chips 8. The bubbles remaining in the light emitting device 1 are pressurized and therefore become a cause of swelling of the light emitting device 1 after the thermocompression bonding or peeling of the LED chips 8 from the light transmissive supports 2, 3. Further, if the bubbles or swelling exists inside the light emitting device 1, in particular, near the LED chips 8, light is non-uniformly scattered, unfavorably leading to a problem in external appearance of the light emitting device 1. According to the first embodiment, the occurrence of the bubbles in the light emitting device 1 can be suppressed based on the various characteristics of the third light transmissive insulator 13, the vacuum thermocompression bonding conditions or the like. It is preferable that bubbles having an outer diameter of 500 μm or more or a size of equal to or larger than an external shape size of the LED chip 8 do not exist in the light emitting device 1 of the embodiment.

For example, since the hot melt adhesive described in the aforementioned Patent Reference 2 melts when heated, it is difficult to perform the bonding process (thermocompression bonding process) under vacuum. Therefore, in the light emitting device produced by thermocompression bonding the stack with the hot melt adhesive sheet intervening, bubbles due to remaining air are likely to remain, and many bubbles are likely to remain, in particular, near the LED chips. The remaining bubbles are formed by pressurization, and swelling of the bubbles occurs with time because the inner pressure is, for example, 0.1 MPa or more. Therefore, the light emitting device having the remaining bubbles, even if lighting up immediately after being produced, loses the electrical connection due to the swelling of the bubbles occurring with time, resulting in non-lighting in many products. Further, there is a possibility that many products come into non-lighting due to bending or thermal history during usage or that a problem in external appearance arises though not into non-lighting. Furthermore, the hot melt adhesive melting when heated cannot prevent damage to the LED chip caused by bumping of the corner part of the LED chip into the conductive circuit layer. The light emitting device 1 and a method for manufacturing the same in the embodiment have been improved in the drawbacks in the manufacturing process of the conventional device.

The pressurizing force to be applied in the vacuum thermocompression bonding of the stack differs depending on the heating temperature, the material and thicknesses a the light transmissive insulating resin sheets 14, 15, the final thickness of the third light transmissive insulator 13 and so on, but is usually preferably in a range of 0.5 to 20 MPa, and more preferably in a range of 1 to 12 MPa. Applying the pressurizing force makes it possible to increase the embedding property of the softened light transmissive insulating resin sheets 14, 15 in the gap between the first light transmissive support 2 and the second light transmissive support 3. Further, it is possible to suppress the decrease in characteristics, breakage and so on of the LED chips 8.

By performing the vacuum thermocompression bonding process in a state that the first light transmissive insulating resin sheet 14 intervenes between the first conductive circuit layer 5 and the first electrodes 9 of the LED chips 8 and the second light transmissive insulating resin sheet 15 intervenes between the second conductive circuit layer 7 and the second electrodes 10 of the LED chips 8, the third light transmissive insulator 13 is obtained which is in close contact with the peripheries of the LED chips 8 while the first electrodes 9 and the first conductive circuit layer 5 are electrically connected with each other and the second electrodes 10 and the second conductive circuit layer 7 are electrically connected with each other. Further, a part of the third light transmissive insulator 13 can be successfully filled in the space between the non-forming surfaces of the first electrodes 9 within the light emitting surfaces of the chip bodies 12 and the first conductive circuit layer 5, thereby suppressing remaining of the bubbles. These make it possible to obtain the light emitting device 1 improved in electrical connection reliability between the conductive circuit layers 5, 7 and the electrodes 9, 10.

Furthermore, controlling the heating temperature or the pressurizing force in the vacuum thermocompression bonding of the stack, or the shape, the hardness or the like of a pressurizing body makes it possible to form the electrical connection regions where the electrode 9, 10 and the conductive circuit layer 5, 7 are in direct contact with each other and the mechanical coupling regions where the electrode 9, 10 and the conductive circuit layer 5, 7 are coupled with each other with a part of the third light transmissive insulator 13 intervening therebetween, on the contact interface between the first electrode 9 or the second electrode 10 and the conductive circuit layer 5, 7 (in particular, the contact interface between the second electrode 10 and the conductive circuit layer 7). By obtaining the contact interface between the electrode 9, 10 and the conductive circuit layer 5, 7 having the structure, the electrical connection reliability can be further increased.

Second Embodiment

Figure 6:
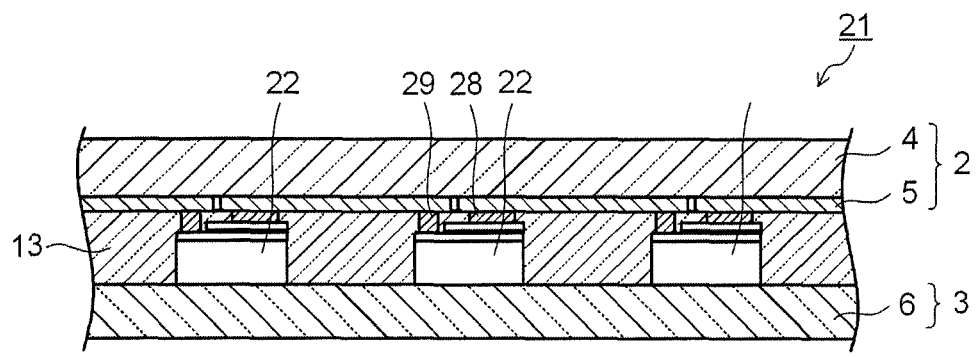
FIG. 6 is a cross-sectional view illustrating a light emitting device according to a second embodiment.
Figure 7:
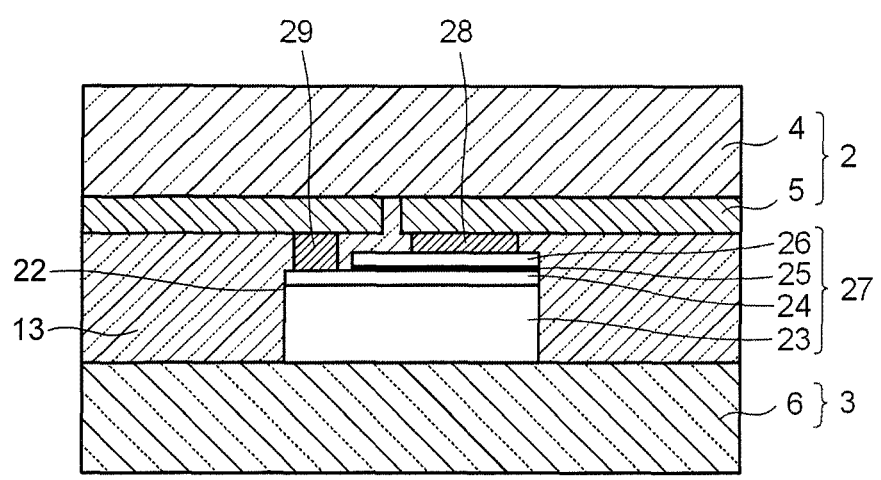
FIG. 7 is a cross-sectional view illustrating the light emitting device illustrated in FIG. 6 with a part thereof enlarged.

Next, a light emitting device and a method for manufacturing the same according to a second embodiment will be described referring to FIG. 6 to FIG. 9. In these drawings, the same portions as those in the first embodiment are denoted by the same symbols and description thereof will be sometimes omitted. A light emitting device 21 according to the second embodiment includes, as illustrated in FIG. 6, a first light transmissive support 2 and a second light transmissive support 3 which are arranged to be opposed to each other with a predetermined gap provided therebetween. Between the first light transmissive support 2 and the second light transmissive support 3, a plurality of LED chips 22 are arranged. The LED chip 22 is configured such that a semiconductor layer is formed on an insulating substrate or a semiconductor substrate and a pair of electrodes are arranged on one surface.

Figure 8:
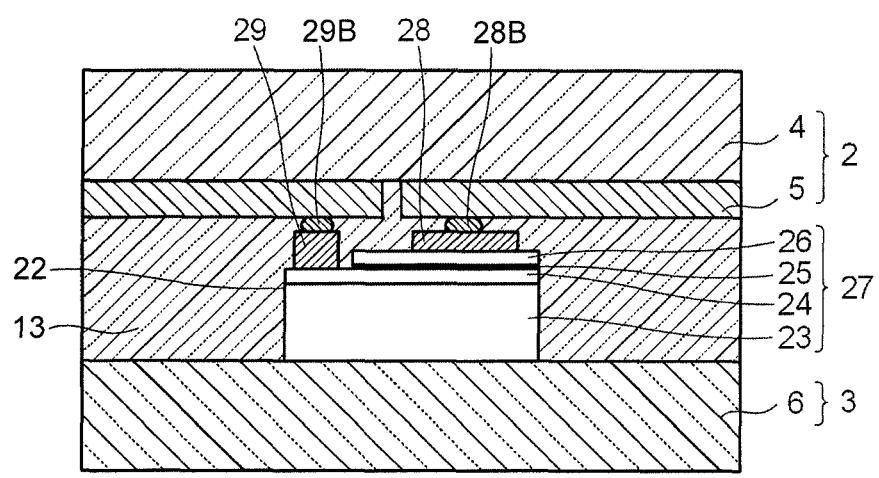
FIG. 8 is a cross-sectional view illustrating a modified example of the light emitting device illustrated in FIG. 6 with a part thereof enlarged.

The LED chip 22 includes, as illustrated in FIG. 6, a chip body (light emitting diode body) 27 having an N-type semiconductor layer (for example, an n-GaN layer) 24, an active layer (for example, an InGaN layer) 25, and a P-type semiconductor layer (for example, a p-GaN layer) 26 formed in order on an insulating substrate 23 such as a sapphire substrate. The arrangement positions of the N-type semiconductor layer and the P-type semiconductor layer may be reversed. In the LED chip 22 having such an element structure, the double-sided electrode structure as in the LED chip 8 used in the first embodiment is not applicable. Therefore, a single-sided electrode structure in which first and second electrodes 28, 29 are provided on the light emitting surface side of the chip body 27 is applied. Also to the LED chip 22 in which the semiconductor layer is formed on the semiconductor substrate, the single-sided electrode structure is sometimes applied. Each of the first and second electrodes 28, 29 of the LED chip 22 is electrically connected to a conductive circuit layer 5 of the first light transmissive support 2. The conductive circuit layer 5 and the first electrode 28 may be electrically connected with each other via a bump electrode 28B provided on the first electrode 28 as illustrated in FIG. 8. Similarly, the conductive circuit layer 5 and the second electrode 29 may be electrically connected with each other via a bump electrode 29B provided on the second electrode 29.

The conductive circuit layer 5 is provided only on the surface of a first light transmissive insulator 4 constituting the first light transmissive support 2. The second light transmissive support 3 has no conductive circuit layer and is composed of only a second light transmissive insulator 6. In a space between the first light transmissive support 2 and the second light transmissive support 3, namely, a space except arrangement portions of the plurality of LED chips 22, a third light transmissive insulator 13 having the above-described Vicat softening temperature, tensile storage elastic modulus, glass transition temperature, and melting temperature is embedded as in the first embodiment. The constituent material of the third light transmissive insulator 13 is preferably a resin such as an elastomer or the like having the above-described Vicat softening temperature, tensile storage elastic modulus, glass transition temperature, and melting temperature in addition to the light transmitting property, the electric insulation property, the flexibility (flexibility) as in the first embodiment. Concrete examples and so on of the elastomer are as described above. The thickness of the third light transmissive insulator 13 is as in the above-described first embodiment.

Use of the resin (in particular, the elastomer) having the above-described Vicat softening temperature, tensile storage elastic modulus, glass transition temperature, and melting temperature makes it possible to embed the third light transmissive insulator 13 in close contact with the plurality of LED chips 22, in the space between the first light transmissive support 2 and the second light transmissive support 3 while successfully maintaining the electrical connection between the conductive circuit layer 5 and the electrodes 28, 29 of the plurality of LED chips 22. In other words, the contact state between the conductive circuit layer 5 and the electrodes 28, 29 is maintained by the third light transmissive insulator 13 arranged in close contact with the peripheries of the LED chips 22. Accordingly, the electrical connection reliability between the conductive circuit layer 5 and the electrodes 28, 29 of the LED chips 22, in particular, the electrical connection reliability between the conductive circuit layer 5 and the electrodes 28, 29 when a bending test, a thermal cycle test (TCT) and so on are performed on the light emitting device 21, can be increased.

Further, use of the resin having the above-described Vicat softening temperature, tensile storage elastic modulus, and melting temperature makes it possible to arrange the third light transmissive insulator 13 also at the peripheries of the first and second electrodes 28, 29. In more detail, in the case where each of the first and second electrodes 28, 29 has an area smaller than that of the light emitting surface of the chip body 27 and a shape projecting from the light emitting surface, a space is generated between the surface (a non-forming surface of the first and second electrodes 28, 29) where the first and second electrodes 28, 29 are not formed within the light emitting surface and the conductive circuit layer 5 in the state that the first and second electrodes 28, 29 are in contact with the conductive circuit layer 5. The resin having the above-described Vicat softening temperature, tensile storage elastic modulus, and melting temperature makes it possible to successfully fill a part of the third light transmissive insulator 13 in the space between the non-forming surface of the first and second electrodes 28, 29 and the conductive circuit layer 5. This also applies to the case of forming the electrodes 28, 29 on the rear surface (the non-light emitting surface) of the chip body. Accordingly, it becomes possible to increase the electrical connection reliability between the conductive circuit layer 5 and the first and second electrodes 28, 29 of the LED chip 22 with higher reproducibility.

As for the contact structure between the conductive circuit layer 5 and the first and second electrodes 28, 29 of the LED chip 22, it is also effective to apply the same structure as that in the first embodiment, namely, a structure in which the electrical connection regions where the conductive circuit layer 5 and the electrode 28, 29 is in direct contact with each other and the mechanical coupling regions where the part of the third light transmissive insulator 13 intervenes between the conductive circuit layer 5 and the electrode 28, 29, are formed on the contact interface between the conductive circuit layer 5 and the first or second electrode 28, 29. This can increase the mechanical coupling property while maintaining the electrical connection between the conductive circuit layer 5 and the electrode 28, 29. In other words, it becomes possible to increase the electrical connection reliability between the conductive circuit layer 5 and the first and second electrodes 28, 29 of the LED chip 22 with higher reproducibility.

Next, a method for manufacturing the light emitting device 21 in the second embodiment will be described referring to FIGS. 9A to 9D. First, the first light transmissive support 2 having the first light transmissive insulator 4 and the conductive circuit layer 5 formed on the surface of the first light transmissive insulator 4, and the second light transmissive support 3 composed of only the second light transmissive insulator 6, are prepared. The constituent material and the forming method and so on of the conductive circuit layer 5 are as described above. Next, a light transmissive insulating resin sheet 30 having a Vicat softening temperature in a range of 80 to 160° C. is prepared. The light transmissive insulating resin sheet 30 preferably uses, as a main component, an elastomer that does not melt at the Vicat softening temperature at a tensile storage elastic modulus between 0° C. and 100° C. in a range of 0.1 to 10 GPa as described above, has a tensile storage elastic modulus at the Vicat softening temperature of 0.1 MPa or more, a melting temperature of 180° C. or higher or higher by 40° C. or more than the Vicat softening temperature, and a glass transition temperature of −20° C. or lower. The light transmissive insulating resin sheet 30 is preferably an elastomer sheet having the above-described Vicat softening temperature, tensile storage elastic modulus, glass transition temperature, and melting temperature, and more preferably an acryl-based elastomer sheet.

Figure 9A:
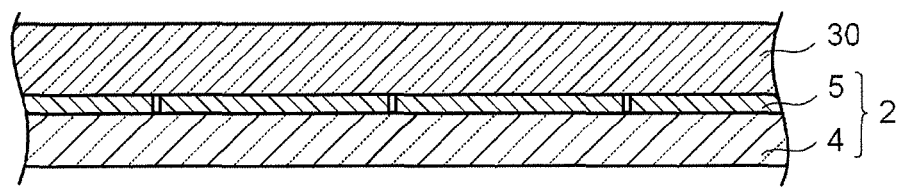
FIG. 9A to FIG. 9D are a cross-sectional view illustrating manufacturing processes of the light emitting device according to the second embodiment.
Figure 9B:
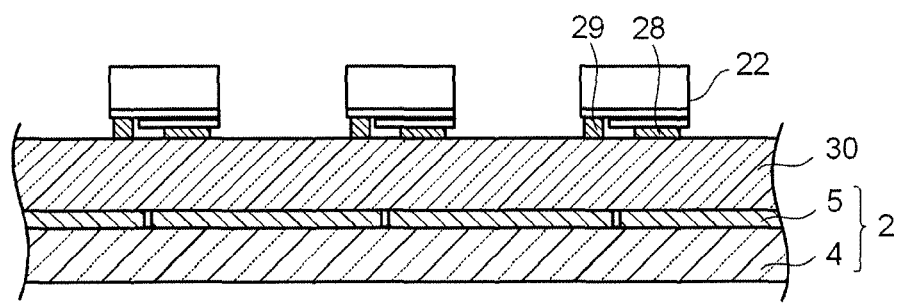
Figure 9C:
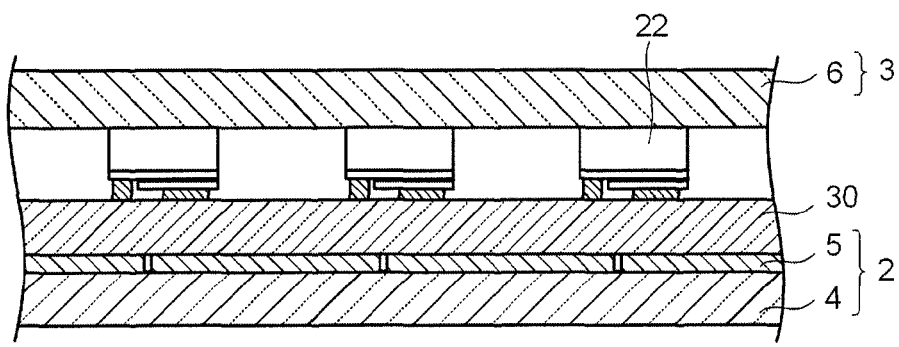

On the conductive circuit layer 5 of the first light transmissive support 2, the light transmissive insulating resin sheet 30 is disposed to cover the entire conductive circuit layer 5 (FIG. 9A). The light transmissive insulating resin sheet 30 has a shape capable of covering the entire conductive circuit layer 5 including portions that become arrangement positions of the LED chips 22 on the conductive circuit layer 5, and the entire light transmissive insulator 4. On the light transmissive insulating resin sheet 30, the plurality of LED chips 22 are arranged (FIG. 9B). The LED chips 22 are disposed such that the first and second electrodes 28, 29 are located on the light transmissive insulating resin sheet 30 side, in other words, located on the conductive circuit layer 5 side. On the LED chips 22, the second light transmissive support 3 is disposed (FIG. 9C). By performing the processes illustrated in FIGS. 9A to 9C, the LED chips 22 are arranged between the first light transmissive insulating resin sheet 30 and the second light transmissive support 3 such that the first and second electrodes 28, 29 are located on the light transmissive insulating resin sheet 30 side.

The light transmissive insulating resin sheet 30 only needs to have a thickness capable of sufficiently filling the space between the first light transmissive support 2 and the second light transmissive support 3, namely, the space based on the gap between the first light transmissive support 2 and the second light transmissive support 3 generated by arranging the LED chips 22 in the vacuum thermocompression bonding process illustrated below. Specifically, the thickness of the light transmissive insulating resin sheet 30 only needs to be able to sufficiently fill the gap between the first light transmissive support 2 and the second light transmissive support 3 based on the height of the LED chip 22. When making the thickness (T) of the third light transmissive insulator 13 smaller than the height (H) of the LED chip 22, it is only necessary to set the thickness of the light transmissive insulating resin sheet 30, corresponding to the difference (H−T) between them.

Figure 9D:
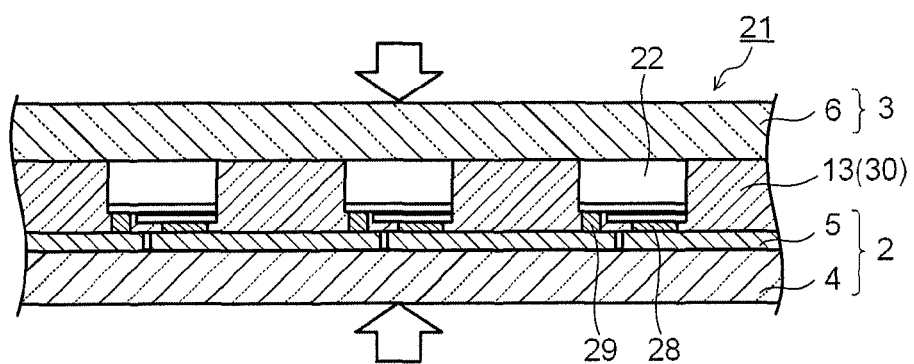

Then, as illustrated in FIG. 9D, a stack in which the first light transmissive support 2, the light transmissive insulating resin sheet 30, the LED chips 22, and the second light transmissive support 3 are stacked in order is pressurized while being heated in a vacuum atmosphere. A heating and pressurizing process (vacuum thermocompression bonding process) in the vacuum atmosphere for the stack is preferably performed under the same conditions as those in the first embodiment. Further, by performing the vacuum thermocompression bonding process in a state that the light transmissive insulating resin sheet 30 intervenes between the conductive circuit layer 5 and the first and second electrodes 28, 29 of the LED chips 22, the third light transmissive insulator 13 is formed which is in close contact with peripheries of the LED chips 22 while the first and second electrodes 28, 29 and the conductive circuit layer 5 are electrically connected with each other. Further, a part of the third light transmissive insulator 13 can be successfully filled in the space between the non-forming surface of the first and second electrodes 28, 29 within the light emitting surface of the chip body 27 and the conductive circuit layer 5. This makes it possible to obtain the light emitting device 21 improved in electrical connection between the conductive circuit layer 5 and the first and second electrodes 28, 29 of the LED chips 22 and its reliability with higher reproducibility.

Third Embodiment

Figure 10:
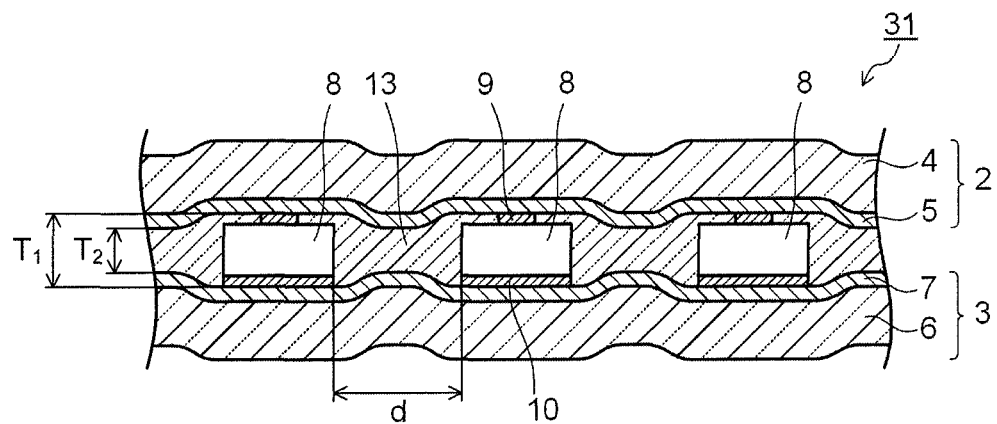
FIG. 10 is a cross-sectional view illustrating a light emitting device according to a third embodiment.

FIG. 10 is a cross-sectional view illustrating a configuration of a light emitting device according to a third embodiment. Note that the same portions as those in the first and second embodiments are denoted by the same symbols and description thereof will be sometimes omitted. A light emitting device 31 illustrated in FIG. 10 includes a first light transmissive support 2 and a second light transmissive support 3 which are arranged to be opposed to each other with a predetermined gap provided therebetween. The first light transmissive support 2 includes a first light transmissive insulator 4 and a first conductive circuit layer 5 formed on the surface of the first light transmissive insulator 4. The second light transmissive support 3 includes a second light transmissive insulator 6 and a second conductive circuit layer 7 formed on the surface of the second light transmissive insulator 6. The first light transmissive support 2 and the second light transmissive support 3 are arranged with a predetermined gap provided therebetween so that the first conductive circuit layer 5 and the second conductive circuit layer 7 are opposed to each other. In the gap between the first light transmissive support 2 and the second light transmissive support 3, a plurality of light emitting diodes 8 are arranged.

For the light transmissive insulators 4, 6, for example, a resin material having an insulation property, a light transmitting property, and flexibility is used. Examples of such a resin material include polyethylene terephthalate (PET), polyethylene naphthalate (PEN), polycarbonate (PC), polyethylene succinate (PES), cyclic olefin resin (for example, ARTON (brand name) manufactured by JSR Corporation), acrylic resin and so on. The total light transmittances (JIS K7105) of the light transmissive insulators 4, 6 are preferably 90% or more, and more preferably 95% or more. The thicknesses of the light transmissive insulators 4, 6 are preferably in a range of 50 to 300 μm. If the thicknesses of the light transmissive insulators 4, 6 are too large, there is a possibility that imparting excellent flexibility to the light transmissive supports 2, 3 becomes difficult and the light transmitting property also decreases. If the thicknesses of the light transmissive insulators 4, 6 are too small, characteristics and so on as the base material for forming the conductive circuit layers 5, 7 cannot be sufficiently obtained.

On the surface of the first light transmissive insulator 4, the first conductive circuit layer 5 is formed. Similarly, on the surface of the second light transmissive insulator 6, the second conductive circuit layer 7 is formed. For the conductive circuit layers 5, 7, for example, a transparent conductive material such as indium tin oxide (ITO), fluorine-doped tin oxide (FTO), zinc oxide, indium zinc oxide (IZO) or the like is used. Examples of the conductive circuit layers 5, 7 made of the transparent conductive material include those made by applying the sputtering method, the electron beam evaporation method or the like to form a thin film and patterning the obtained thin film through laser beam machining, etching treatment or the like to form a circuit. The conductive circuit layers 5, 7 may be those made by applying a mixture of fine particles (for example, fine particles having an average particle size in a range of 10 to 100 nm) of the transparent conductive material and a transparent resin binder into a circuit shape by the screen printing or the like, or those made by performing patterning processing by the laser beam machining or photolithography to a coating film of the aforementioned mixture to form a circuit.

The conductive circuit layers 5, 7 are not limited to those made of the transparent conductive material but may be those made by forming fine particles of an opaque conductive material such as gold, silver or the like in a mesh form. For example, the conductive circuit layers 5, 7 in the mesh form are formed by applying a photosensitive compound of the opaque conductive material such as silver halide and then performing exposure and developing treatments thereon. Further, the conductive circuit layers 5, 7 may be formed by applying slurry containing opaque conductive material fine particles by the screen printing or the like in the mesh formed. The conductive circuit layers 5, 7 only need to be those that exhibit the light transmitting property when they are formed on the surfaces of the light transmissive insulators 4, 6 and provide the light transmissive supports 2, 3. The conductive circuit layers 5, 7 preferably have light transmitting properties so that the total light transmittances (JIS K7105) of the light transmissive supports 2, 3 are 10% or more and the total light transmittance as the whole light emitting device 31 is 1% or more. If the total light transmittance as the whole light emitting device 31 is less than 1%, the light emitting point is not recognized as a luminescent spot any longer. The light transmitting properties of the conductive circuit layers 5, 7 themselves differ depending on their configurations, but the total light transmittances are preferably in a range of 10 to 85%. If the total light transmittances of both of the conductive circuit layers 5, 7 exceed 85%, a wiring pattern becomes easily recognizable by the naked eyes, resulting in inconvenience as the light emitting device 31.

Between the surface having the first conductive circuit layer 5 of the first light transmissive support 2 and the surface having the second conductive circuit layer 7 of the second light transmissive support 3, the plurality of light emitting diodes 8 are arranged. As the light emitting diode, a diode chip having a PN junction (hereinafter, written as an LED chip 8) is generally used. The light emitting diode used herein is not limited to the LED chip 8 but may be a laser diode (LD) chip or the like. The plurality of LED chips 8 are arranged so that a minimum distance d being a minimum interval between the chips is 500 μm or more. The minimum distance d between the plurality of LED chips 8 is the distance from the outer peripheral surface of one LED chip 8 to the outer peripheral surface of the LED chip 8 located at the position closest thereto. Note that the minimum distance d between the LED chips 8 will be described later.

Figure 11:
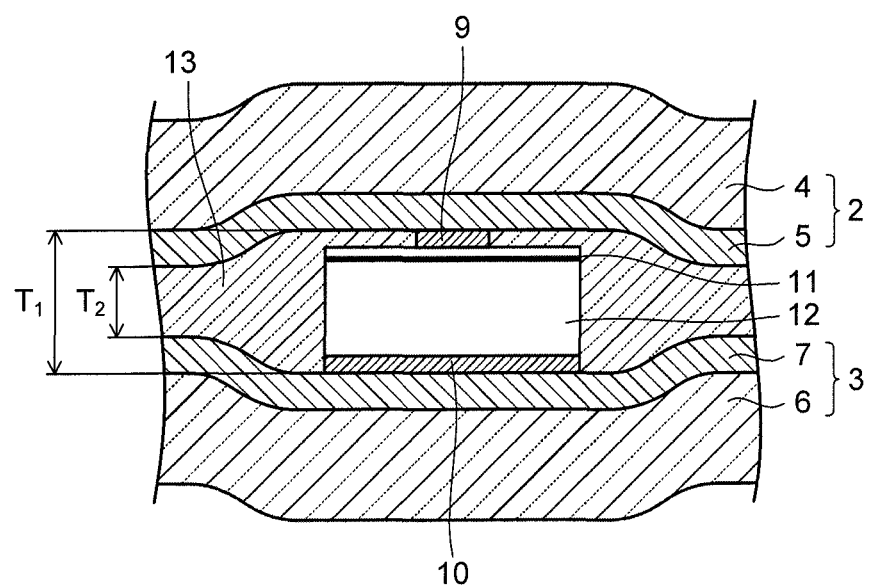
FIG. 11 is a cross-sectional view illustrating the light emitting device illustrated in FIG. 10 with a part thereof enlarged.

As the LED chip 8, for example, the one in which a P-type semiconductor layer is formed on an N-type semiconductor substrate, the one in which an N-type semiconductor layer is formed on a P-type semiconductor substrate, the one in which an N-type semiconductor layer and a P-type semiconductor layer are formed on a semiconductor substrate, the one in which a P-type hetero semiconductor layer and an N-type hetero semiconductor layer are formed on a P-type semiconductor substrate, the one in which an N-type hetero semiconductor layer and a P-type hetero semiconductor layer are formed on an N-type semiconductor substrate, and so on are known, and in any of them, electrodes 9, 10 are provided on both the upper and lower surfaces of the LED chips 8. The LED chip 8 used in the third embodiment includes as illustrated in FIG. 11: a chip body (light emitting diode body) 12 having an active layer (a PN junction interface, a semiconductor layer being a light emitting region of a double heterojunction structure or the like) 11; the first electrode 9 provided on a surface (light emitting surface) on the side close to the active layer 11 of the chip body 12; and the second electrode 10 provided on a surface (non-light emitting surface) on the side far from the active layer 11 of the chip body 12.

Figure 12:
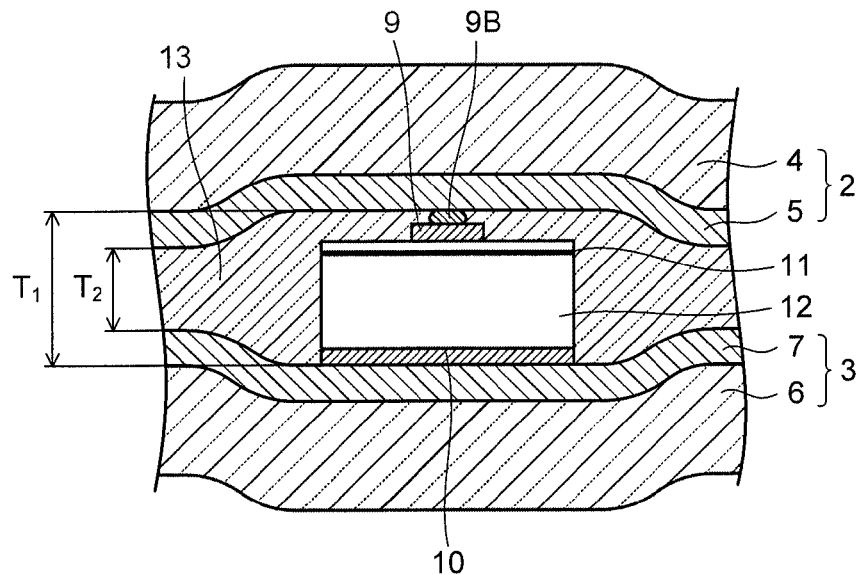
FIG. 12 is a cross-sectional view illustrating a modified example of the light emitting device illustrated in FIG. 10 with a part thereof enlarged.

The first electrode 9 is in direct contact with the first conductive circuit layer 5 and thereby electrically connected thereto. As described later, pressing the first conductive circuit layer 5 against the first electrode 9 electrically connects the first conductive circuit layer 5 and the first electrode 9. Similarly, the second electrode 10 is in direct contact with the second conductive circuit layer 7 and thereby electrically connected thereto. Pressing the second conductive circuit layer 7 against the second electrode 10 electrically connects the second conductive circuit layer 7 and the second electrode 10. The conductive circuit layer 5 and the first electrode 9 may be electrically connected with each other via a bump electrode 9B provided on the first electrode 9 as illustrated in FIG. 12. The LED chip 8 lights up by the DC voltage applied thereto via the first and second electrodes 9, 10.

The first electrode 9 provided on the light emitting surface of the chip body 12 has an area smaller than that of the light emitting surface so as not to hinder light emission from the active layer 11 from being released to the outside. The light emitting surface of the chip body 12 has a forming surface and a non-forming surface of the first electrode 9. Further, the first electrode 9 has a shape projecting from the light emitting surface, for example, a shape projecting 0.1 μm or more. The second electrode 10 is provided on the entire non-light emitting surface of the chip body 12. The surface (a contact surface with the conductive circuit layer 7) of the second electrode 10 preferably has, for example, a projecting and recessed shape of 1 μm or more in order to increase the electrical connection reliability with the second conductive circuit layer 7, and more preferably has a shape with repeated fine projections and recesses. The surface (a contact surface with the conductive circuit layer 5) of the first electrode 9 also preferably has the same projecting and recessed shape. Note that on the surface of the electrode of an ordinary LED chip, a projecting and recessed shape is sometimes formed in addition to that for improving the electrical connection reliability.

In a portion except arrangement portions of the plurality of LED chips 8 between the first light transmissive support 2 and the second light transmissive support 3, a third light transmissive insulator 13 is embedded. The third light transmissive insulator 13 preferably has a Vicat softening temperature in a range of 80 to 160° C. The tensile storage elastic modulus between 0° C. and 100° C. of the third light transmissive insulator 13 is preferably in a range of 0.01 to 10 GPa. The Vicat softening temperature of the third light transmissive insulator 13 is more preferably in a range of 100 to 140° C. The tensile storage elastic modulus between 0° C. and 100° C. of the third light transmissive insulator 13 is preferably in a range of 0.1 to 7 GPa.

It is further preferable that the third light transmissive insulator 13 does not melt at the Vicat softening temperature and has a tensile storage elastic modulus at the Vicat softening temperature of 0.1 MPa or more. The third light transmissive insulator 13 preferably has a melting temperature of 180° C. or higher, or a melting temperature higher by 40° C. or more than the Vicat softening temperature. In addition, the third light transmissive insulator 13 preferably has a glass transition temperature of −20° C. or lower. The glass transition temperature of the third light transmissive insulator 13 is more preferably −40° C. or lower. The measurement methods of those characteristics are as described above.

The third light transmissive insulator 13 is preferably composed of a light transmissive insulating resin, in particular, an elastomer, satisfying characteristics such as the above-described Vicat softening temperature, tensile storage elastic modulus, melting temperature, glass transition temperature and so on. As the elastomer, an acryl-based elastomer, an olefin-based elastomer, a styrene-based elastomer, an ester-based elastomer, an urethane-based elastomer and so on are known. Among them, the acryl-based elastomer satisfying the above-described characteristics is excellent in flowability when softened, adhesiveness after curing, weather resistance and so on in addition to light transmitting property, electric insulation property, flexibility and so on, and is thus suitable as the constituent material of the third light transmissive insulator 13. The third light transmissive insulator 13 is preferably composed of the material containing the above-described elastomer as a main component, and may contain another resin component and so on as necessary.

The third light transmissive insulator 13 has a thickness smaller than a height $T_1$ (a height from the surface of the first electrode 9 to the surface of the second electrode 10) of the LED chip 8 in order to increase the contact property between the conductive circuit layers 5, 7 and the electrodes 9, 10. Note that in the case where a bump electrode 9A is provided on the first electrode 9, the height $T_1$ of the LED chip 8 is assumed to indicate the height from the top portion of the bump electrode 9A to the surface of the second electrode 10. The light transmissive support 2, 3 in close contact with the third light transmissive insulator 13 has a shape curved inward from a portion where the LED chip 8 is arranged toward intermediate portions with respect to the LED chips 8 adjacent thereto. The first and the second light transmissive supports 2, 3 have shapes curved inward from opposite directions respectively. Accordingly, the first light transmissive support 2 presses the first conductive circuit layer 5 against the first electrode 9 and the second light transmissive support 3 presses the second conductive circuit layer 7 against the second electrode 10. They can increase the electrical connection between the conductive circuit layers 5, 7 and the electrodes 9, 10 and its reliability.

The third light transmissive insulator 13 has a minimum thickness $T_2$ smaller than the height $T_1$ of the LED chip 8 by a range of 5 μm or more and ½ $T_1$ or less, namely, a minimum thickness $T_2$ between the adjacent LED chips 8. In other words, the difference $\Delta T(T_1-T_2)$ between the height $T_1$ of the LED chip 8 and the minimum thickness $T_2$ of the third light transmissive insulator 13 is in a range of 5 μm or more and ½ $T_1$ or less. If the thickness difference $\Delta T$ is less than 5 μm, the force pressing the conductive circuit layers 5, 7 against the electrodes 9, 10 is insufficient, thus making the electrical connection state between the conductive circuit layers 5, 7 and the electrodes 9, 10, in particular, the electrical connection state in the bending resistance test and the thermal cycle test unstable. If the thickness difference $\Delta T$ exceeds ½ of the height $T_1$ (½ $T_1$) of the LED chip 8, maintenance of the shape of the third light transmissive insulator 13 may become difficult or the adhesiveness to the LED chip 8 or the like may decrease. The thickness difference $\Delta T$ is more preferably in a range of 20 to 80 μm.

The minimum thickness $T_2$ of the third light transmissive insulator 13 needs to be set in consideration of the minimum distance d between the LED chips 8 in addition to the height $T_1$ of the LED chip 8. In the case where the minimum distance d between the LED chips 8 is small, when the difference $\Delta T$ ($T_1-T_2$) between the height $T_1$ of the LED chip 8 and the minimum thickness $T_2$ of the third light transmissive insulator 13 is made too small, the curved shapes of the conductive circuit layers 5, 7 become too sharp and may cause a defect. In other words, the corner on the light emitting surface side of the LED chip 8 bites into the first conductive circuit layer 5, and, for example, the N-type semiconductor layer and the P-type semiconductor layer of the LED chip 8 may short-circuit due to the first conductive circuit layer 5. This becomes a cause of occurrence of defective light emission of the LED chip 8. Hence, in the light emitting device 31 in this embodiment, the minimum thickness $T_2$ of the third light transmissive insulator 13 is set based on the height $T_1$ of the LED chip 8 and the minimum distance d between the LED chips 8.

Figure 13:
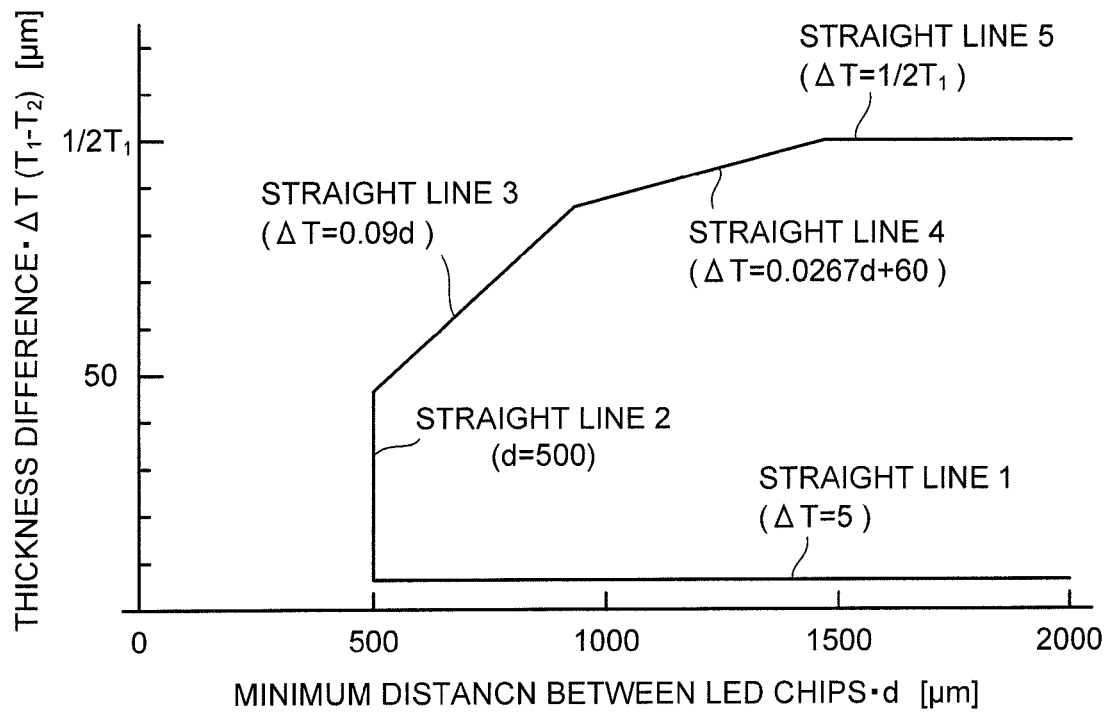
FIG. 13 is a chart indicating the relationship between a difference $\Delta T$ between a height $T_1$ of the light emitting diode and a minimum thickness $T_2$ of a third light transmissive insulator, and, a minimum distance d between the light emitting diodes.

The minimum thickness $T_2$ of the third light transmissive insulator 13 is set so that the difference $\Delta T$ ($T_1-T_2$) from the height $T_1$ of the LED chip 8 falls within a range surrounded by a straight line 1 expressed by $\Delta T=5$, a straight line 2 expressed by $d=500$, a straight line 3 expressed by $\Delta T=0.09d$, a straight line 4 expressed by $\Delta T=0.0267d+60$, and a straight line 5 expressed by $\Delta T=\frac{1}{2} T_1$, in a graph with the thickness difference $\Delta T$ [unit:μm] plotted on a vertical axis and the minimum distance d [unit:μm] between the LED chips 8 plotted on a horizontal axis as indicated in FIG. 13. If the minimum distance d between the LED chips 8 is less than 500 μm, it is difficult to provide the thickness difference $\Delta T$, so that the electrical connection state between the conductive circuit layers 5, 7 and the electrodes 9, 10 cannot be successfully maintained.

The difference $\Delta T$ between the height $T_1$ of the LED chip 8 and the minimum thickness $T_2$ of the third light transmissive insulator 13 is based on the range of 5 μm or more and $\frac{1}{2} T_1$ or less, but in the case where the minimum distance d between the LED chips 8 is short (roughly about 500 to 1000 μm), if the thickness difference $\Delta T$ is made too large, the aforementioned short circuit of the LED chip 8 is likely to occur due to the conductive circuit layer 5. In particular, the short circuit of the LED chip 8 is likely to occur in the bending resistance test and the thermal cycle test. Therefore, the upper limit of the thickness difference $\Delta T$ is the straight line 3 ($\Delta T=0.09d$). In the case where the minimum distance d between the LED chips 8 is sufficiently long (roughly about 1500 μm or more), even if the thickness difference $\Delta T$ is made large, there is no longer possibility that the LED chip 8 short-circuits, so that the upper limit of the thickness difference $\Delta T$ is the straight line 5 ($\Delta T=\frac{1}{2} T_1$). In the case of an intermediate region between them (the minimum distance d is roughly about 1000 to 1500 μm), the upper limit of the thickness difference $\Delta T$ is the straight line 4.

As described above, setting the minimum thickness $T_2$ of the third light transmissive insulator 13 so that the difference $\Delta T$ ($T_1-T_2$) from the height $T_1$ of the LED chip 8 falls within the range surrounded by the straight line 1, the straight line 2, the straight line 3, the straight line 4, and the straight line 5 indicated in FIG. 13 makes it possible to increase the electrical connection between the conductive circuit layers 5, 7 and the electrodes 9, 10 of the LED chip 8 and its reliability and further suppress the occurrence of defects such as the short circuit of the LED chip 8 due to the conductive circuit layers 5, 7 with high reproducibility. It is possible to suppress occurrence of defects such as the short circuit of the LED chip 8 also in the bending resistance test and the thermal cycle test. Accordingly, the electrical connection reliability between the conductive circuit layers 5, 7 and the electrodes 9, 10 of the LED chip 8 and the reliability of the LED chip itself can be increased with high reproducibility. In other words, also in the case where the bending resistance test, the thermal cycle test (TCT) and so on are performed, a light emitting device 31 can be provided which is excellent in light emitting reliability of each LED chip. Though the minimum distance d between the LED chips 8 is not particularly limited, the light emitting device 31 in the embodiment is effective when the plurality of LED chips 8 are densely mounted so that the minimum distance d between the LED chips 8 is 1500 μm or less.

Here, in the light emitting device described in the aforementioned Patent Reference 4, namely, the light emitting device composed of a thermocompressed body of the stack in which the LED chips are disposed in the through holes of the light transmissive insulator, the conductive circuit layer is pressed against the electrodes of the LED chips for electrical connection, so that when a plurality of LED chips 8 are tried to be densely mounted, the electrical connection is likely to be unstable. Further, when the light emitting device is bent so that the radius of curvature becomes about 100 mm, the contact between the conductive circuit layers and the electrodes cannot be maintained any longer. Furthermore, there is a high possibility that the LED chips do not light up any longer at a thermal cycle of about 500 cycles. As described in the aforementioned Patent References 3, 4, when the electrodes of the LED chips and the conductive circuit layers are bonded together with a conductive adhesive, it is difficult to sufficiently insulate the plurality of LED chips from one another and therefore cause complication of a connection process, an increase in man-hour and so on, resulting in that the manufacturing cost is likely to increase. The light emitting device 31 in this embodiment has been improved in the drawbacks of the conventional devices.

Further, using the above-described elastomer having a Vicat softening temperature in a range of 80 to 160° C. makes it possible to embed the third light transmissive insulator 13 in close contact with the plurality of LED chips 8, in the space between the first light transmissive support 2 and the second light transmissive support 3. The contact state between the conductive circuit layers 5, 7 and the electrodes 9, 10 is maintained by the third light transmissive insulator 13 arranged in close contact with the peripheries of the LED chips 8. Accordingly, the electrical connection state between the conductive circuit layers 5, 7 and the electrodes 9, 10 can be further successfully maintained. If the Vicat softening temperature of the elastomer exceeds 160° C., the elastomer cannot be sufficiently softened in the formation process of the third light transmissive insulator 13, whereby the electrical connection between the conductive circuit layers 5, 7 and the electrodes 9, 10 may decrease. On the other hand, if the Vicat softening temperature of the elastomer is below 80° C., the power for holding the LED chips 8 is insufficient, whereby the electrical connection reliability between the conductive circuit layers 5, 7 and the electrodes 9, 10 may decrease.

Regarding the state around the first electrode 9, it is preferable to arrange the third light transmissive insulator 13 also at the periphery of the first electrode 9. In the case where the first electrode 9 has the area smaller than that of the light emitting surface of the chip body 12 and the shape projecting from the light emitting surface, a space is generated between the surface (the non-forming surface of the first electrode 9) where the first electrode 9 is not formed within the light emitting surface and the first conductive circuit layer 5 in the state that the first electrode 9 is in contact with the conductive circuit layer 5. The third light transmissive insulator 13 is preferably filled also in a minute space between the non-forming surface of the first electrode 9 and the first conductive circuit layer 5. The filling state of the third light transmissive insulator 13 in the minute space can be improved by using the elastomer having a Vicat softening temperature in a range of 80 to 160° C.

As for the contact structure between the second conductive circuit layer 7 and the second electrode 10 of the LED chip 8, the third light transmissive insulator 13 exists in close contact with the periphery of the second electrode 10, so that the contact state is successfully maintained. Further, when the surface of the second electrode 10 has the projecting and recessed shape, the projections in the projecting and recessed shape can be brought into direct contact with the conductive circuit layer 7 to form electrical connection regions, and the third light transmissive insulator 13 can be filled in at least a part of the recesses in the projecting and recessed shape to form mechanical coupling regions. More specifically, the electrical connection regions where the conductive circuit layer 7 and the electrode 10 are in direct contact with each other and the mechanical coupling regions where the third light transmissive insulator 13 intervenes between the conductive circuit layer 7 and the electrode 10, are formed on the contact interface between the conductive circuit layer 7 and the electrode 10. This can increase the mechanical coupling property while maintaining the electrical connection between the conductive circuit layer 7 and the electrode 10. In other words, it becomes possible to increase the electrical connection reliability between the second conductive circuit layer 7 and the second electrode 10 of the LED chip 8 with higher reproducibility.

The contact interface having the above-described electrical connection regions and mechanical coupling regions is effective not only to the contact portion between the second conductive circuit layer 7 and the second electrode 10 but also to the contact portion between the first conductive circuit layer 5 and the first electrode 9. The contact interface having the electrical connection regions and the mechanical coupling regions can be obtained not only when they have the projecting and recessed shapes but also when the electrodes 9, 10 have relatively flat surfaces, also by controlling the vacuum thermocompression bonding conditions and so on of the later-described transmissive insulating resin sheets. In short, controlling the drawn state and the like of the resin sheets in the thermocompression bonding under vacuum of the light transmissive insulating resin sheets makes it possible to obtain the contact interfaces between the conductive circuit layers 5, 7 and the electrodes 9, 10 having the electrical connection regions and the mechanical coupling regions.

Next, a method for manufacturing the light emitting device 31 in the third embodiment will be described referring to FIGS. 14A to 14E. First, the first light transmissive support 2 having the first light transmissive insulator 4 and the first conductive circuit layer 5 formed on the surface of the first light transmissive insulator 4, and the second light transmissive support 3 having the second light transmissive insulator 6 and the second conductive circuit layer 7 formed on the surface of the second light transmissive insulator 6, are prepared. The constituent material and the forming method and so on of the conductive circuit layers 5, 7 are as described above. Then, first and second light transmissive insulating resin sheets 14, 15 are prepared. The light transmissive insulating resin sheets 14, 15 are more preferably elastomer sheets having a Vicat softening temperature in a range of 80 to 160° C. as described above, and furthermore preferably acryl-based elastomer sheets.

The tensile storage elastic modulus of the elastomer sheet constituting the light transmissive insulating resin sheet 14, 15 between 0° C. and 100° C. is preferably in a range of 0.1 to 7 GPa. It is further preferable that the elastomer sheet does not melt at the Vicat softening temperature and has a tensile storage elastic modulus at the Vicat softening temperature of 0.1 MPa or more. The elastomer sheet preferably has a melting temperature of 180° C. or higher, or a melting temperature higher by 40° C. or more than the Vicat softening temperature. The glass transition temperature of the elastomer sheet is preferably −20° C. or lower.

Figure 14A:
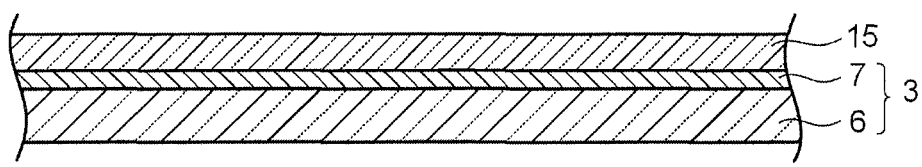
FIG. 14A to FIG. 14E are a cross-sectional view illustrating manufacturing processes of the light emitting device according to the third embodiment.
Figure 14B:
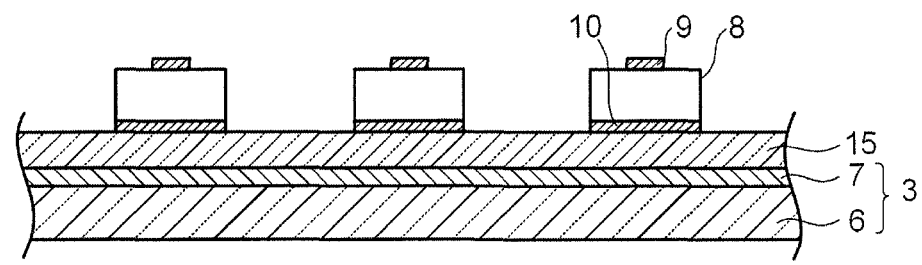
Figure 14C:
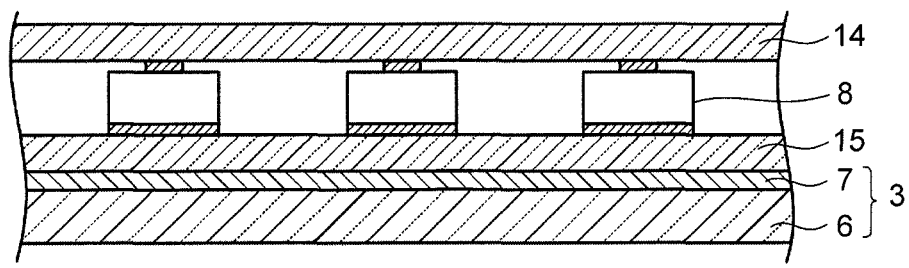
Figure 14D:
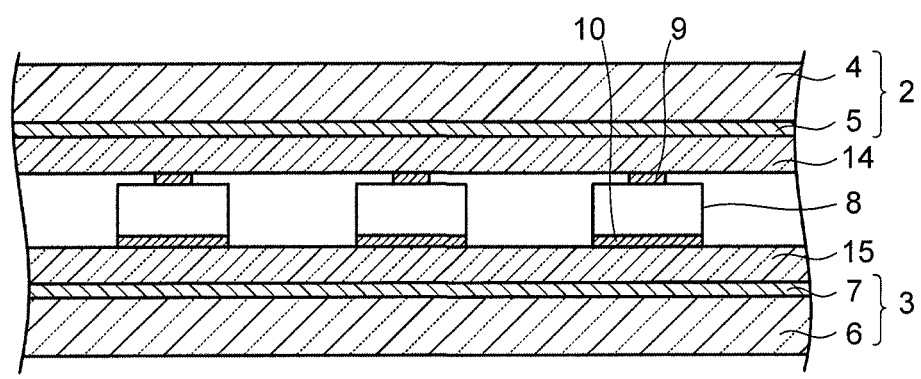

On the second conductive circuit layer 7 of the second light transmissive support 3, the second light transmissive insulating resin sheet 15 is disposed to cover the entire conductive circuit layer 7 (FIG. 14A). The second light transmissive insulating resin sheet 15 has a shape capable of covering the entire conductive circuit layer 7 including portions that become arrangement positions of the LED chips 8 on the conductive circuit layer 7, and the entire light transmissive insulator 6. On the second light transmissive insulating resin sheet 15, the plurality of LED chips 8 are arranged (FIG. 14B). The plurality of LED chips 8 are disposed such that the second electrodes 10 are located on the second light transmissive insulating resin sheet 15 side, in other words, located on the second conductive circuit layer 7 side and the minimum distance d is 500 μm or more. Further, on the plurality of LED chips 8, the first light transmissive insulating resin sheet 14 is disposed (FIG. 14C), and the first light transmissive support 2 is disposed thereon (FIG. 14D).

The first light transmissive support 2 is disposed such that the first conductive circuit layer 5 faces the first light transmissive insulating resin sheet 14. The first light transmissive insulating resin sheet 14 has a shape capable of covering the entire conductive circuit layer 5 including portions that become the arrangement positions of the LED chips 8 on the conductive circuit layer 5, and further the entire light transmissive insulator 4. Accordingly, on the first light transmissive support 2 disposed on the first light transmissive insulating resin sheet 14, the entire first conductive circuit layer 5 is covered with the first light transmissive insulating resin sheet 15. By performing the processes illustrated in FIGS. 14A to 14D, the LED chips 8 are arranged between the first light transmissive insulating resin sheet 14 and the second light transmissive insulating resin sheet 15 such that the first electrodes 9 are located on the first light transmissive insulating resin sheet 14 side and the second electrodes 10 are located on the second light transmissive insulating resin sheet 15 side.

The first and second light transmissive insulating resin sheets 14, 15 only need to have thicknesses capable of sufficiently filling the space between the first light transmissive support 2 and the second light transmissive support 3, namely, the space based on the gap between the first light transmissive support 2 and the second light transmissive support 3 generated by arranging the LED chips 8 in the vacuum thermocompression bonding process illustrated below. Specifically, the total thickness of the first and second light transmissive insulating resin sheets 14, 15 only needs to be a thickness enough to form the third light transmissive insulator 13 having a shape based on the above-described difference $\Delta T$ ($T_1-T_2$) between the height $T_1$ of the LED chip 8 and the minimum thickness $T_2$ of the third light transmissive insulator 13.

Figure 14E:
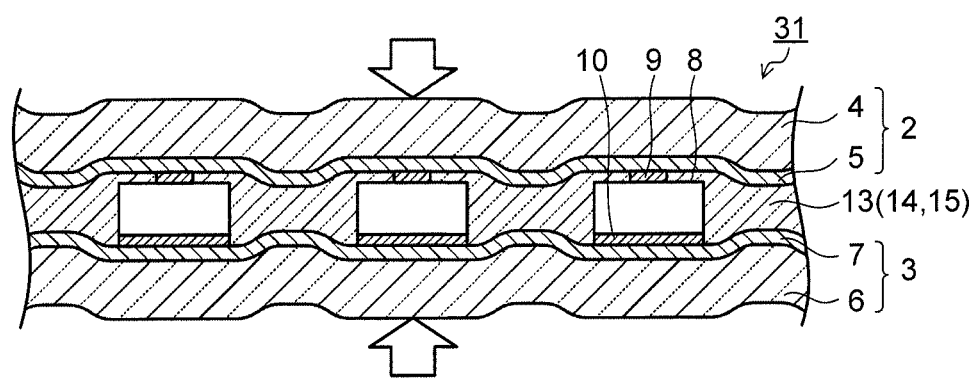

Then, as illustrated in FIG. 14E, a stack in which the second light transmissive support 3, the second light transmissive insulating resin sheet 15, the LED chips 8, the first light transmissive insulating resin sheet 14, and the first light transmissive support 2 are stacked in order is pressurized while being heated in a vacuum atmosphere. A pressurizing process for the stack is preferably performed using a pressure device capable of locally applying a pressure between adjacent LED chips 8, for example, a pressure device having a pressure plate provided with an elastic body such as rubber on the surface so that the minimum thickness $T_2$ of the third light transmissive insulator 13 is smaller than the height $T_1$ of the LED chip 8. This can make the difference $\Delta T$ ($T_1-T_2$) between the height $T_1$ of the LED chip 8 and the minimum thickness $T_2$ of the third light transmissive insulator 13 fall within the range surrounded by the straight line 1, the straight line 2, the straight line 3, the straight line 4, and the straight line 5 indicated in FIG. 13.

A heating and pressurizing process (vacuum thermocompression bonding process) in the vacuum atmosphere for the stack is preferably performed by pressurizing the stack while heating it to a temperature T in a range of Mp−10 (° C.)≤T≤Mp+30 (° C.) with respect to a Vicat softening temperature Mp (° C.) of the light transmissive insulating resin sheets 14, 15. Applying such heating conditions makes it possible to pressurize the stack in a state that the light transmissive insulating resin sheets 14, 15 are moderately softened. Accordingly, it is possible to, while connecting the first electrodes 9 disposed on the conductive circuit layer 5 via the light transmissive insulating resin sheet 14 to predetermined positions on the first conductive circuit layer 5 and connecting the second electrodes 10 disposed on the conductive circuit layer 7 via the light transmissive insulating resin sheet 15 to predetermined positions on the second conductive circuit layer 7, embed the softened light transmissive insulating resin sheets 14, 15 in the space between the first light transmissive support 2 and the second light transmissive support 3 to form the third light transmissive insulator 13.

If the heating temperature T in the thermocompression bonding of the stack is below a temperature lower than by 10 (° C.) than the Vicat softening temperature Mp of the light transmissive insulating resin sheets 14, 15 (T<Mp−10), there is a possibility that the softening of the light transmissive insulating resin sheets 14, 15 becomes insufficient, so that the adhesiveness of the light transmissive insulating resin sheets 14, 15 (accordingly, the third light transmissive insulator 13) to the LED chip 8 decreases. Further, there is a possibility that the light transmissive insulating resin sheets 14, 15 (accordingly, the third light transmissive insulator 13) cannot be successfully filled in the space between the non-forming surface of the first electrode 9 within the light emitting surface of the chip body 12 and the first conductive circuit layer 5. If the heating temperature T exceeds a temperature higher by 30 (° C.) than the Vicat softening temperature Mp of the light transmissive insulating resin sheets 14, 15 (Mp+30<T), there is a possibility that the light transmissive insulating resin sheets 14, 15 are softened too much to cause a defective shape or the like.

The thermocompression bonding process in the vacuum atmosphere for the stack is preferably performed as follows. Preliminarily pressurization is performed on the above-described stack to bring its components into close contact with one another. Then, a working space in which the preliminarily pressurized stack is placed is evacuated, and then pressurization is performed on the stack while heating it to the above-described temperature. Thermocompression bonding the preliminarily pressurized stack in the vacuum atmosphere as described above makes it possible to embed the softened light transmissive insulating resin sheets 14, 15 in the space between the first light transmissive support 2 and the second light transmissive support 3 without any gap therebetween. The vacuum atmosphere in the thermocompression bonding is preferably 5 Pa or less. The preliminarily pressurization process can be omitted, but in this case, positional displacement or the like becomes likely to occur in the stack, and therefore it is preferable to perform the preliminarily pressurization process.

When the thermocompression bonding process for the stack is performed under the air atmosphere or a low vacuum, bubbles are likely to remain in the light emitting device 31 after the thermocompression bonding, in particular, around the LED chips 8. The bubbles remaining in the light emitting device 31 are pressurized and therefore become a cause of swelling of the light emitting device 31 after the thermocompression bonding or peeling of the LED chips 8 from the light transmissive supports 2, 3. Further, if the bubbles or swelling exists inside the light emitting device 31, in particular, near the LED chips 8, light is non-uniformly scattered, unfavorably leading to a problem in external appearance of the light emitting device 31. According to the third embodiment, the occurrence of the bubbles in the light emitting device 31 can be suppressed based on the various characteristics of the third light transmissive insulator 13, the vacuum thermocompression bonding conditions or the like. It is preferable that bubbles having an outer diameter of 500 μm or more or a size of equal to or larger than an external shape size of the LED chip 8 do not exist in the light emitting device 31 of the embodiment.

For example, since the hot melt adhesive described in the aforementioned Patent Reference 2 melts when heated, it is difficult to perform the bonding process (thermocompression bonding process) under vacuum. Therefore, in the light emitting device produced by thermocompression bonding the stack with the hot melt adhesive sheet intervening, bubbles due to remaining air are likely to remain, and many bubbles are likely to remain, in particular, near the LED chips. The remaining bubbles are formed by pressurization, and swelling of the bubbles occurs with time because the inner pressure is, for example, 0.1 MPa or more. Therefore, the light emitting device having the remaining bubbles, even if lighting up immediately after being produced, loses the electrical connection due to the swelling of the bubbles occurring with time, resulting in non-lighting in many products. Further, there is a possibility that many products come into non-lighting due to bending or thermal history during usage or that a problem in external appearance arises though not into non-lighting. Furthermore, the hot melt adhesive melting when heated cannot prevent damage to the LED chip caused by bumping of the corner part of the LED chip into the conductive circuit layer. The light emitting device 31 and a method for manufacturing the same in the embodiment have been improved in the drawbacks in the manufacturing process of the conventional device.

The pressurizing force to be applied in the thermocompression bonding of the stack differs depending on the heating temperature, the material and thicknesses of the light transmissive insulating resin sheets 14, 15, the final thickness of the third light transmissive insulator 13 and so on, but is usually preferably in a range of 0.5 to 20 MPa, and more preferably in a range of 1 to 12 MPa. Applying the pressurizing force makes it possible to increase the embedding property of the softened light transmissive insulating resin sheets 14, 15 in the gap between the first light transmissive support 2 and the second light transmissive support 3. Further, it is possible to suppress the decrease in characteristics, breakage and so on of the LED chips 8.

By performing the vacuum thermocompression bonding process in a state that the first light transmissive insulating resin sheet 14 intervenes between the first conductive circuit layer 5 and the first electrodes 9 of the LED chips 8 and the second light transmissive insulating resin sheet 15 intervenes between the second conductive circuit layer 7 and the second electrodes 10 of the LED chips 8, the thickness of the third light transmissive insulator 13 can be controlled in a desired range while the first electrodes 9 and the first conductive circuit layer 5 are electrically connected with each other and the second electrodes 10 and the second conductive circuit layer 7 are electrically connected with each other. Further, it is possible to bring the third light transmissive insulator 13 into close contact with the peripheries of the LED chips 8 including the peripheries of the first electrodes 9. This makes it possible to obtain the light emitting device 31 improved in electrical connection reliability between the conductive circuit layers 5, 7 and the electrodes 9, 10.

Furthermore, controlling the heating temperature or the pressurizing force in the vacuum thermocompression bonding of the stack, or the shape, the hardness or the like of a pressurizing body makes it possible to form the electrical connection regions where the electrode 9, 10 and the conductive circuit layer 5, 7 are in direct contact with each other and the mechanical coupling regions where the electrode 9, 10 and the conductive circuit layer 5, 7 are coupled with each other with the third light transmissive insulator 13 intervening therebetween, on the contact interface between the first electrode 9 or the second electrode 10 and the conductive circuit layer 5, 7 (in particular, the contact interface between the second electrode 10 and the conductive circuit layer 7). By obtaining the contact interface between the electrode 9, 10 and the conductive circuit layer 5, 7 having the structure, the electrical connection reliability can be further increased.

Fourth Embodiment

Figure 15:
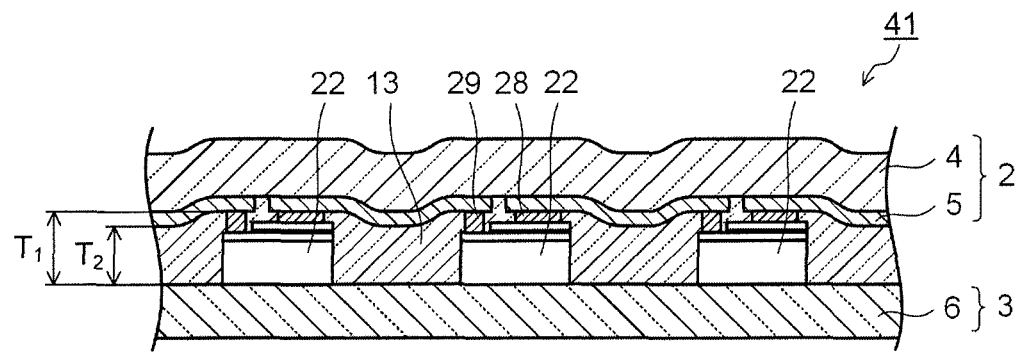
FIG. 15 is a cross-sectional view illustrating a light emitting device according to a fourth embodiment.

Next, a light emitting device and a method for manufacturing the same according to a fourth embodiment will be described referring to FIG. 15 to FIG. 18. In these drawings, the same portions as those in the first to third embodiments are denoted by the same symbols and description thereof will be sometimes omitted. A light emitting device 41 according to the fourth embodiment includes, as illustrated in FIG. 15, a first light transmissive support 2 and a second light transmissive support 3 which are arranged to be opposed to each other with a predetermined gap provided therebetween. In the gap between the first light transmissive support 2 and the second light transmissive support 3, a plurality of LED chips 22 are arranged. The LED chip 22 is configured such that a semiconductor layer is formed on an insulating substrate or a semiconductor substrate and a pair of electrodes are arranged on one surface (the upper surface in FIG. 15).

Figure 16:
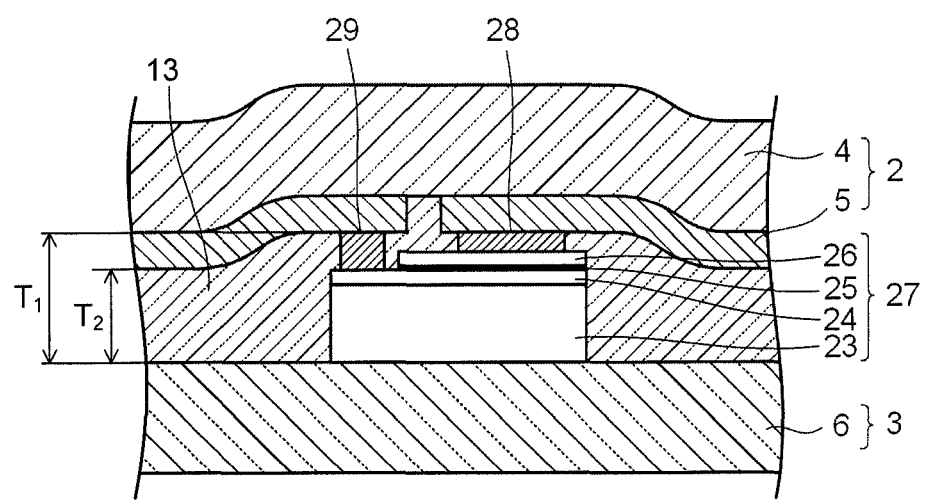
FIG. 16 is a cross-sectional view illustrating the light emitting device illustrated in FIG. 15 with a part thereof enlarged.
Figure 17:
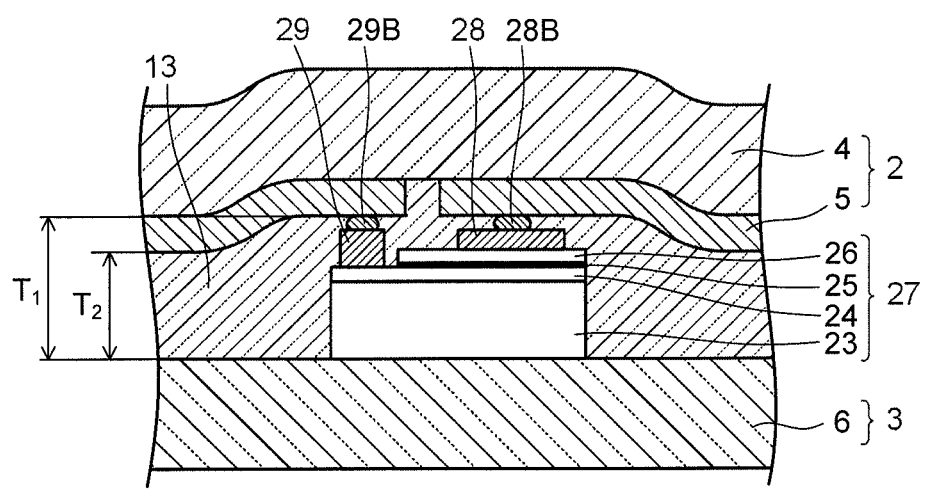
FIG. 17 is a cross-sectional view illustrating a modified example of the light emitting device illustrated in FIG. 15 with a part thereof enlarged.

The LED chip 22 includes, as illustrated in FIG. 16, a chip body (light emitting diode body) 27 having an N-type semiconductor layer (for example, an n-GaN layer) 24, an active layer (for example, an InGaN layer) 25, and a P-type semiconductor layer (for example, a p-GaN layer) 26 formed in order on an insulating substrate 23 such as a sapphire substrate. The arrangement positions of the N-type semiconductor layer and the P-type semiconductor layer may be reversed. In the LED chip 22 having the element structure, a double-sided electrode structure as in the LED chip 8 used in the third embodiment is not applicable. Therefore, a single-sided electrode structure in which first and second electrodes 28, 29 are provided on one surface side of the chip body 27 is applied. Also to the LED chip 22 in which the semiconductor layer is formed on the semiconductor substrate, the single-sided electrode structure is sometimes applied. Each of the first and second electrodes 28, 29 of the LED chip 22 is electrically connected to a first conductive circuit layer 5 of the first light transmissive support 2. The first conductive circuit layer 5 and the first electrode 28 may be electrically connected with each other via a bump electrode 28B provided on the first electrode 28 as illustrated in FIG. 17. Similarly, the conductive circuit layer 5 and the second electrode 29 may be electrically connected with each other via a bump electrode 29B provided on the second electrode 29.

The first conductive circuit layer 5 is provided only on the surface of a first light transmissive insulator 4 constituting the first light transmissive support 2. The second light transmissive support 3 has no conductive circuit layer and is composed of only a second light transmissive insulator 6. In a space between the first light transmissive support 2 and the second light transmissive support 3, namely, a space except arrangement portions of the plurality of LED chips 22, a third light transmissive insulator 13 is embedded as in the third embodiment. The constituent material of the third light transmissive insulator 13 preferably has the same characteristics such as the Vicat softening temperature, tensile storage elastic modulus, melting temperature, and glass transition temperature as those in the third embodiment, and the light transmitting property, the electric insulation property, the flexibility (bendability), and is more preferably an elastomer. Concrete examples and so on of the elastomer are as described above.

The third light transmissive insulator 13 has a thickness smaller than a height $T_1$ of the LED chip 22 as in the third embodiment in order to increase the contact property between the conductive circuit layer 5 and the first and second electrodes 28, 29. The first light transmissive support 2 in close contact with the third light transmissive insulator 13 has a shape curved inward from a portion where the LED chip 22 is arranged toward intermediate portions with respect to the LED chips 8 adjacent thereto. Accordingly, the first light transmissive support 2 presses the first conductive circuit layer 5 against the first and second electrodes 28, 29. This can increase the electrical connection between the conductive circuit layer 5 and the first and second electrodes 28, 29 and its reliability.

The third light transmissive insulator 13 has a minimum thickness $T_2$ smaller than the height $T_1$ of the LED chip 22 by a range of 5 μm or more and ½ $T_1$ or less. In other words, the difference $\Delta T$ ($T_1-T_2$) between the height $T_1$ of the LED chip 22 and the minimum thickness $T_2$ of the third light transmissive insulator 13 is in a range of 5 μm or more and ½ $T_1$ or less. Further, the minimum thickness $T_2$ of the third light transmissive insulator 13 is set so that the difference $\Delta T$ ($T_1-T_2$) from the height $T_1$ of the LED chip 22 falls within a range surrounded by a straight line 1 expressed by $\Delta T=5$, a straight line 2 expressed by d=500, a straight line 3 expressed by $\Delta T=0.09d$, a straight line 4 expressed by $\Delta T=0.0267d+60$, and a straight line 5 expressed by $\Delta T=½ T_1$, indicated in FIG. 13. The reason for defining the minimum thickness $T_2$ of the third light transmissive insulator 13 and the thickness difference $\Delta T$ is the same as that in the third embodiment.

As described above, setting the minimum thickness $T_2$ of the third light transmissive insulator 13 so that the difference $\Delta T$ ($T_1-T_2$) from the height $T_1$ of the LED chip 22 falls within the range surrounded by the straight line 1, the straight line 2, the straight line 3, the straight line 4, and the straight line 5 indicated in FIG. 13 makes it possible to increase the electrical connection between the conductive circuit layer 5 and the first and second electrodes 28, 29 of the LED chip 22 and its reliability and further suppress the occurrence of defects such as the short circuit of the LED chip 22 due to the conductive circuit layer 5 with high reproducibility. It is possible to suppress occurrence of defects such as the short circuit of the LED chip 22 also in the bending resistance test and the thermal cycle test. Accordingly, the electrical connection reliability between the conductive circuit layer 5 and the first and second electrodes 28, 29 of the LED chip 22 and the reliability of the LED chip 22 itself can be increased with high reproducibility. In other words, also in the case where the bending resistance test, the thermal cycle test (TCT) and so on are performed, a light emitting device 41 can be provided which is excellent in light emitting reliability of each LED chip. Though the minimum distance d between the LED chips 8 is not particularly limited, the light emitting device 41 in the embodiment is effective when a plurality of LED chips 8 are densely mounted so that the minimum distance d between the LED chips 8 is 1500 μm or less.

The first light transmissive insulator 4 is preferably formed of an insulating resin body (sheet or the like) having the light transmitting property and the flexibility in order to inwardly curve the first light transmissive support 2. However, the second light transmissive insulator 6 is not limited to the insulating resin body but may be made of, for example, an inorganic material having both the insulation property and the light transmitting property such as, for example, glass. In the case of using a glass substrate as the light transmissive insulator 6, it is impossible to impart the flexibility to the whole light emitting device 41. In the case of imparting the flexibility to the light emitting device 41, it is preferable to form not only the first light transmissive insulator 4 but also the second light transmissive insulator 6 using insulating resin bodies having the light transmitting property and the flexibility.

It is possible to arrange the third light transmissive insulator 13 also at the peripheries of the first and second electrodes 28, 29 as in the third embodiment. In more detail, in the case where each of the first and second electrodes 28, 29 has an area smaller than that of an electrode forming surface (for example, the light emitting surface) of the chip body 27 and a shape projecting from the electrode forming surface, a space is generated between the surface (a non-forming surface of the first and second electrodes 28, 29) where the first and second electrodes 28, 29 are not formed within the electrode forming surface and the conductive circuit layer 5 in the state that the first and second electrodes 28, 29 are in contact with the conductive circuit layer 5. It is preferable to fill the third light transmissive insulator 13 also in the minute space between the non-forming surface of the first and second electrodes 28, 29 and the conductive circuit layer 5.

As for the contact structure between the conductive circuit layer 5 and the first and second electrodes 28, 29 of the LED chip 22, it is effective to apply the same structure as that in the third embodiment, namely, the structure in which the electrical connection regions where the conductive circuit layer 5 and the electrode 28, 29 are in direct contact with each other and the mechanical coupling regions where the third light transmissive insulator 13 intervenes between the conductive circuit layer 5 and the electrode 28, 29, are formed on the contact interface between the conductive circuit layer 5 and the first or second electrode 28 or 29. This can increase the mechanical coupling property while maintaining the electrical connection between the conductive circuit layer 5 and the electrode 28, 29. In other words, it becomes possible to increase the electrical connection reliability between the conductive circuit layer 5 and the first and second electrodes 28, 29 of the LED chip 22 with higher reproducibility.

Next, a method for manufacturing the light emitting device 41 in the fourth embodiment will be described referring to FIGS. 18A to 18D. First, the first light transmissive support 2 having the first light transmissive insulator 4 and the first conductive circuit layer 5 formed on the surface of the first light transmissive insulator 4, and the second light transmissive support 3 composed of only the second light transmissive insulator 6, are prepared. The constituent material and the forming method and so on of the conductive circuit layer 5 are as described above. Next, a light transmissive insulating resin sheet 30 is prepared. The light transmissive insulating resin sheet 30 is preferably the same elastomer sheet as that in the third embodiment, and more preferably an acryl-based elastomer sheet. The characteristics of the elastomer sheet are as described above.

Figure 18A:
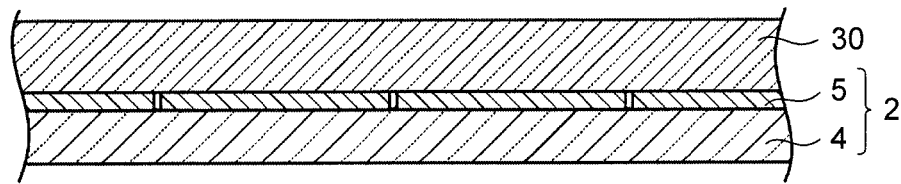
FIG. 18A to FIG. 18D are a cross-sectional view illustrating manufacturing processes of the light emitting device according to the fourth embodiment.
Figure 18B:
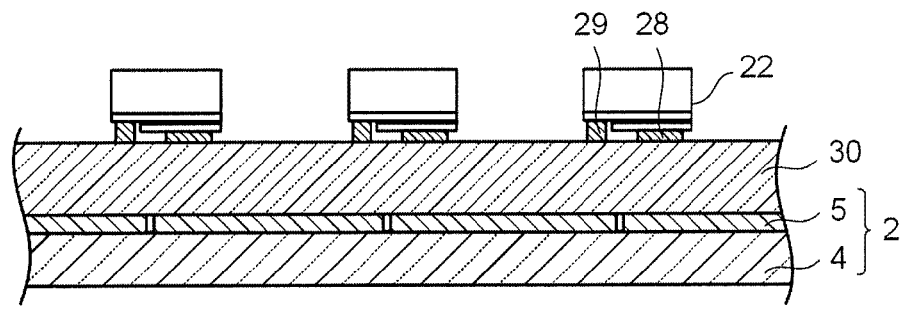
Figure 18C:
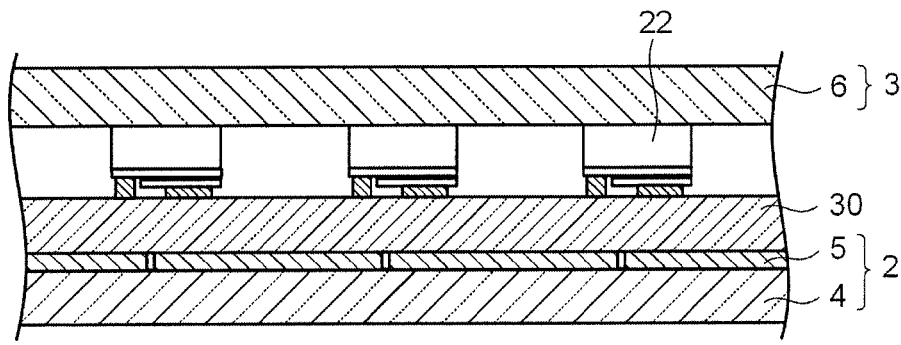

On the conductive circuit layer 5 of the first light transmissive support 2, the light transmissive insulating resin sheet 30 is disposed to cover the entire conductive circuit layer 5 (FIG. 18A). The light transmissive insulating resin sheet 30 has a shape capable of covering the entire conductive circuit layer 5 including portions that become arrangement positions of the LED chips 22 on the conductive circuit layer 5, and the entire first light transmissive support 2. On the light transmissive insulating resin sheet 30, the plurality of LED chips 22 are arranged (FIG. 18B). The LED chips 22 are disposed such that the first and second electrodes 28, 29 are located on the light transmissive insulating resin sheet 30 side, in other words, located on the conductive circuit layer 5 side. Further, the second light transmissive support 3 is disposed on the LED chips 22 so that the minimum distance d is 500 μm or more (FIG. 18C). By performing the processes illustrated in FIGS. 18A to 18C, the LED chips 22 are arranged between the light transmissive insulating resin sheet 30 and the second light transmissive support 3.

The light transmissive insulating resin sheet 30 only needs to have a thickness capable of sufficiently filling the space between the first light transmissive support 2 and the second light transmissive support 3, namely, the space based on the gap between the first light transmissive support 2 and the second light transmissive support 3 generated by arranging the LED chips 22 in the vacuum thermocompression bonding process. Specifically, the thickness of the light transmissive insulating resin sheet 30 only needs to be a thickness enough to form the third light transmissive insulator 13 having a shape based on the above-described difference ΔT ($T_1-T_2$) between the height $T_1$ of the LED chip 22 and the minimum thickness $T_2$ of the third light transmissive insulator 13.

Figure 18D:
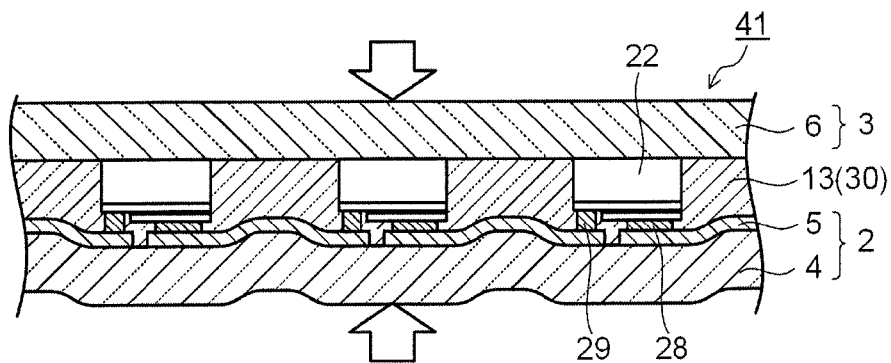

Then, as illustrated in FIG. 18D, a stack in which the first light transmissive support 2, the light transmissive insulating resin sheet 30, the LED chips 22, and the second light transmissive support 3 are stacked in order is pressurized while being heated in a vacuum atmosphere. A heating and pressurizing process (vacuum thermocompression bonding process) in the vacuum atmosphere for the stack is preferably performed under the same conditions as those in the third embodiment. Further, by performing the vacuum thermocompression bonding process in a state that the light transmissive insulating resin sheet 30 intervenes between the conductive circuit layer 5 and the electrodes 28, 29 of the LED chips 22, the thickness of the third light transmissive insulator 13 can be controlled into a desired range while the first and second electrodes 28, 29 and the conductive circuit layer 5 are electrically connected with each other. Further, it is possible to bring the third light transmissive insulator 13 into close contact with the peripheries of the LED chips 22 including the peripheries of the electrodes 28, 29. This makes it possible to obtain the light emitting device 41 improved in electrical connection reliability between the conductive circuit layer 5 and the first and second electrodes 28, 29.

Note that though the light emitting devices 1, 21, 31, 41 each having the LED chips 8, 22 sandwiched between the two light transmissive insulators 4, 6 and the third light transmissive insulator 13 have been described in the first to fourth embodiments, these illustrated configurations of the light emitting devices merely basic configurations of the present invention, and various omissions, substitutions, changes, additions and so on may be made without departing from the basic configurations of the embodiments. For example, even a light emitting device composed of three light transmissive insulators in total with the first light transmissive support 2 formed using two light transmissive insulators 4, even a light emitting device in which the numbers of light transmissive insulators of the light transmissive supports 2, 3 are variously changed, and the like, can provide the same effects as those of the first to fourth embodiments. This is examples of the number of light transmissive insulators, and various changes and addition may be made for the other configurations without departing from the basic configurations of the embodiments.

Fifth Embodiment

Figure 19:
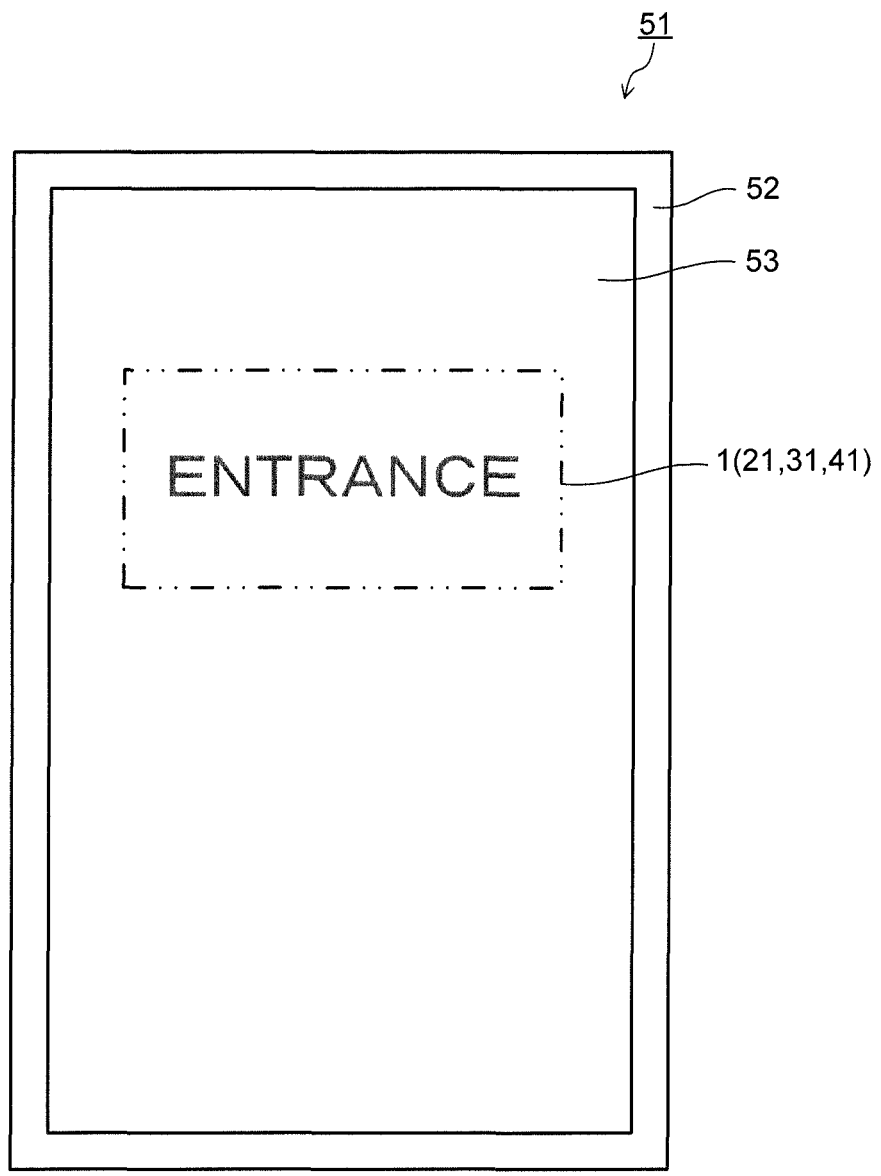
FIG. 19 is an application example of the light emitting device according to the embodiment.

The light emitting devices 1, 21, 31, 41 in the first to fourth embodiments use the light transmissive members for the supports 2, 3 that hold the LED chips 8, 22 therebetween, and therefore suitable for display devices that display various character strings, geometrical figures and patterns and the like on a door or a window of a building such as a shop, a showroom, an office or the like, display devices such as a display plate, a bulletin board and the like, vehicular lamps such as a brake lamp, a blinker lamp and the like. FIG. 19 illustrates a door 51 of a building to which the light emitting device 1 (21, 31, 41) in the embodiment is attached, as a usage example of the light emitting devices 1, 21, 31, 41 in the embodiments. The door 51 illustrated in FIG. 19 includes a glass plate 53 installed in a door frame 52, and the light emitting device 1 (21, 31, 41) attached to the glass plate 53. The light emitting device 1 (21, 31, 41) has the light transmitting property as a whole, and therefore enables, for example, display as the door (ENTRANCE in FIG. 19) and never loses transparency of the glass plate 53 constituting the door 51. As described above, the light emitting devices 1, 21, 31, 41 in the embodiments are suitably used for various display devices and lamps required to have transparency.

EXAMPLES

Next, concrete examples and their evaluation results will be described.

Example 1

First, polyethylene terephthalate sheets having a thickness of 180 μm were prepared as first and second light transmissive insulators. On the surface of the polyethylene terephthalate sheet as the first light transmissive insulator, slurry made by dispersing ITO fine particles in an ultraviolet cure acryl-based transparent resin binder was printed to form a conductive circuit layer in which six linearly arranged LED chips were connected in series, thereby producing a first light transmissive support. Also on the surface of the polyethylene terephthalate sheet as the second light transmissive insulator, a conductive circuit layer was similarly formed to produce a second light transmissive support. As first and second light transmissive insulating resin sheets, acryl-based elastomer sheets having a Vicat softening temperature of 110° C., a melting temperature of 220° C., a glass transition temperature of −40° C., a tensile storage elastic modulus at 0° C. of 1.1 GPa, a tensile storage elastic modulus at 100° C. of 0.3 GPa, a tensile storage elastic modulus at 110° C. being a Vicat softening point of 0.2 GPa, and a thickness of 60 μm were prepared.

The Vicat softening temperature was obtained using a heat distortion tester No. 148-HD-PC manufactured by Yasuda Seiki Seisakusho, Ltd. under the conditions of a test load of 10 N and a rate of heating of 50° C./hour and under A50 condition described in JIS K7206 (ISO 306). The glass transition temperature and the melting temperature were obtained by the method complying with JIS K7121 (ISO 3146), using a differential scanning calorimeter DSC-60 manufactured by Shimadzu Corporation, at a rate of heating of 5° C./min, by heat flux differential scanning calorimetry. The tensile storage elastic modulus was obtained complying with JIS K7244-4 (ISO 6721-4), using a dynamic viscoelasticity automatic measuring device DDV-01GP manufactured by A&D Company, Limited, at a rate of uniform heating of 1° C./min from −100° C. to 200° C., and at a frequency of 10 Hz. The characteristic values of elastomers in the following working examples and comparative examples were measured by the same method and conditions as those in Example 1.

Six red light emitting AlGaAs/GaAs-based LED chips were prepared. The prepared LED chip includes a first electrode provided on the light emitting surface side of the chip body and a second electrode provided on the non-light emitting surface of the chip body, and has a height of 175 μm. The first electrode has an area smaller than that of the light emitting surface of the chip body and has a shape projecting from the light emitting surface. A projecting amount of the first electrode from the light emitting surface is 3 μm. An area ratio of the forming surface of the first electrode to the light emitting surface of the chip body is about 20%. About 80% (area ratio) of the light emitting surface of the chip body is the non-forming surface of the electrode. The second electrode is formed on the entire non-light emitting surface of the chip body and its surface is provided with fine projections and recesses.

On the conductive circuit layer of the second light transmissive support, the second light transmissive insulating resin sheet was placed to cover the entire conductive circuit layer and light transmissive insulator, and the six LED chips were arranged at predetermined positions on the second light transmissive insulating resin sheet. The six LED chips were arranged such that their second electrodes were located on the second light transmissive insulating resin sheet side. On the six LED chips, the first light transmissive insulating resin sheet and the first light transmissive support were stacked. The first light transmissive insulating resin sheet was arranged such that the conductive circuit layer of the first light transmissive support was located on the first light transmissive insulating resin sheet side. The first light transmissive insulating resin sheet has a shape covering the entire conductive circuit layer and light transmissive insulator of the first light transmissive support.

Then, a stack in which the second light transmissive support, the second light transmissive insulating resin sheet, the LED chips, the first light transmissive insulating resin sheet, and the first light transmissive support were stacked in order was preliminarily pressed with a pressure of 0.1 MPa, and then a working space was evacuated to 0.1 kPa. The stack was pressed with a pressure of 9.8 MPa while being heated to 120° C. in a vacuum atmosphere of 5 kPa. This heating and pressurizing state was kept for 10 minutes to embed the first and second light transmissive insulating resin sheets between the first light transmissive support and the second light transmissive support to thereby form a third light transmissive insulator, while electrically connecting the electrodes of the LED chips and the conductive circuit layers. Thereafter, sealing processing using an ultraviolet cure resin was performed on an end face, thereby producing a light emitting device. The obtained light emitting device was subjected to later-described characteristic evaluation.

About the light emitting device thus obtained, bubbles and a status of swelling caused thereby were visually confirmed with the naked eyes after it was left to stand for 24 hours from production. As a result, visible bubbles and swelling seemed to be caused thereby were not observed. The evaluation of bubbles was carried out as follows. The front surface or the rear surface of the light emitting device was visually observed, and the presence or absence of bubbles was primarily confirmed. Samples in which bubbles were not observed in the primary confirmation were determined to have no bubbles, and the inspection was finished. Samples in which bubbles were observed in the primary inspection were subjected to photographing of the bubbles using a microscope with camera. Using the photograph, a distance between arbitrary two points on a contour of the bubble was measured, and a length having a maximum distance was defined as an outer diameter. Then, the case where the outer diameter of the bubble was an LED chip size or more, or 500 μm or more was determined to have bubbles, and samples other than those were determined to have no bubbles.

Next, for confirming a filling structure of the third light transmissive insulator, the LED chip and its surroundings were observed under SEM. As a result, as indicated in FIG. 4, it was confirmed that a part of the third light transmissive insulator was successfully filled between the non-forming surface of the first electrode within the light emitting surface of the LED chip and the conductive circuit layer. It was confirmed that the electrical connection regions where the second electrode and the conductive circuit layer were in direct contact with each other and the mechanical coupling regions where a part of the third light transmissive insulator intervened between the second electrode and the conductive circuit layer, were formed on the contact interface between the second electrode and the conductive circuit layer. The same observation results with the naked eyes and SEM were obtained also in Examples 2, 18.

Examples 2 to 5

Light emitting devices were produced as in Example 1 except that an acryl-based elastomer sheet having the Vicat softening temperature, tensile storage elastic modulus, glass transition temperature, and melting temperature listed in Table 2 and Table 3 was used as the light transmissive insulating resin sheet, and that the heating temperature listed in Table 3 was applied in pressurization. These light emitting devices were subjected to later-described characteristic evaluation.

Examples 6 to 10

Light emitting devices were produced as in Example 1 except that the conductive circuit layer was formed of an ITO sputtered film, and an acryl-based elastomer sheet having the Vicat softening temperature, tensile storage elastic modulus, glass transition temperature, and melting temperature listed in Table 2 and Table 3 was used as the light transmissive insulating resin sheet, and that the heating temperature listed in Table 3 was applied in pressurization. These light emitting devices were subjected to characteristic evaluation.

Example 11

Polyethylene terephthalate sheets having a thickness of 180 μm were prepared as first and second light transmissive insulators. On the surface of the polyethylene terephthalate sheet as the first light transmissive insulator, a conductive circuit layer in which six linearly arranged LED chips were connected in series was formed as in Working Example 1, thereby producing a first light transmissive support. The polyethylene terephthalate sheet as the second light transmissive insulator was used as it was as the second light transmissive support. As the light transmissive insulating resin sheet, an acryl-based elastomer sheet having a Vicat softening temperature of 110° C., a glass transition temperature of −40° C., a melting temperature of 220° C., a tensile storage elastic modulus at 0° C. of 1.1 GPa, a tensile storage elastic modulus at 100° C. of 0.3 GPa, a tensile storage elastic modulus at 110° C. being a Vicat softening point of 0.3 GPa, and a thickness of 60 μm was prepared.

Six blue light emitting GaN-based LED chips were prepared. The prepared LED chip includes first and second electrodes provided on the light emitting surface side of the chip body, and has a height of 90 μm. Each of the first and second electrodes has an area smaller than that of the light emitting surface of the chip body and has a shape projecting from the light emitting surface. A projecting amount of the electrode from the light emitting surface is 1 μm. An area ratio of the forming surface of the first and second electrodes to the light emitting surface of the chip body is about 15%. About 85% (area ratio) of the light emitting surface of the chip body is the non-forming surface of the electrodes.

On the conductive circuit layer of the first light transmissive support, the light transmissive insulating resin sheet was placed to cover the entire conductive circuit layer, and the six LED chips were arranged at predetermined positions on the light transmissive insulating resin sheet. The six LED chips were arranged such that their first and second electrodes were located on the light transmissive insulating resin sheet side. On the six LED chips, the second light transmissive support was stacked. Then, the stack in which the first light transmissive support, the light transmissive insulating resin sheet, the LED chips, and the second light transmissive support were stacked in order was subjected to heating and pressurization processing under vacuum under the same conditions as those in Working Example 1. Sealing processing using an ultraviolet cure resin was performed on an end face, thereby producing a light emitting device. The obtained light emitting device was subjected to later-described characteristic evaluation.

Example 12

A light emitting device was produced as in Example 11 except that the conductive circuit layer was formed of an ITO sputtered film. The obtained light emitting device was subjected to later-described characteristic evaluation.

Example 13

Polyethylene terephthalate sheets having a thickness of 180 μm were prepared as first and second light transmissive insulators. On the surface of the polyethylene terephthalate sheet as the first light transmissive insulator, slurry made by dispersing Ag fine particles in an acryl-based transparent resin binder was printed into a mesh shape with an opening of 0.5 mm to form a conductive circuit layer in which six linearly arranged LED chips were connected in series, thereby producing a first light transmissive support. Also on the surface of the polyethylene terephthalate sheet as the second light transmissive insulator, a conductive circuit layer was similarly formed to produce a second light transmissive support. A light emitting device was produced as in Example 1 except that the first and second light transmissive supports were used. The obtained light emitting device was subjected to later-described characteristic evaluation.

Examples 14 to 17

Light emitting devices were produced as in Example 13 except that an acryl-based elastomer sheet having the Vicat softening temperature, tensile storage elastic modulus, glass transition temperature, and melting temperature listed in Table 2 and Table 3 was used as the light transmissive insulating resin sheet, and that the heating temperature listed in Table 3 was applied in pressurization. The light emitting devices were subjected to later-described characteristic evaluation.

Example 18

A light emitting device was produced as in Example 11 except that the same conductive circuit layer in the mesh form as that in Example 13 was used. The obtained light emitting device was subjected to later-described characteristic evaluation.

Comparative Examples 1 to 6

Light emitting devices were produced as in Example 1 except that an acryl-based elastomer sheet having the Vicat softening temperature, tensile storage elastic modulus, glass transition temperature, and melting temperature listed in Table 2 and Table 3 was used as the light transmissive insulating resin sheet, and that the heating temperature listed in Table 3 was applied in pressurization. These light emitting devices were subjected to later-described characteristic evaluation.

Comparative Example 7

First and second light transmissive supports were produced as in Example 1. Acryl-based highly viscous adhesive sheets having a thickness of 100 µm were prepared, and through holes slightly larger than the LED chips were formed therein so that six LED chips were linearly arranged. The acryl-based highly viscous adhesive sheet having the through holes was placed on the second light transmissive support, and then the same LED chips as those in Examples 1 were arranged in the through holes. Thereon, the first light transmissive support was stacked, and then the resultant was sandwiched between thermal drums and thereby pressed with a pressure of 9.8 MPa while being heated to 160° C. Thereafter, sealing processing was performed on an end face, whereby a light emitting device was produced. The obtained light emitting device was subjected to later-described characteristic evaluation.

Comparative Example 8

First and second light transmissive supports were produced as in Example 11. At predetermined positions on the second light transmissive support, the same six blue light emitting GaN-based LED chips as those in Example 11 were arranged. The surfaces of the LED chips on the sapphire substrate side were fixed to the second light transmissive support with an adhesive. The first light transmissive support was stacked on the LED chips, and then an acrylic pressure sensitive adhesive was filled under a vacuum atmosphere in the gap between the first light transmissive support and the second light transmissive support. The acrylic pressure sensitive adhesive was irradiated with an ultraviolet ray and thereby partially cured, whereby a light emitting device was produced. The obtained light emitting device was subjected to later-described characteristic evaluation.

Comparative Example 9

On the surface of a polyethylene terephthalate sheet having a thickness of 180 µm becoming a first light transmissive insulator, slurry made by dispersing ITO fine particles was printed to form a first conductive circuit layer. Then, on a polyethylene terephthalate sheet having a thickness of 180 µm becoming a second light transmissive insulator, an acryl-based elastomer sheet having a Vicat softening temperature of 110° C., a glass transition temperature of −10° C., a melting temperature of 220° C., a tensile storage elastic modulus at 0° C. of 0.006 GPa, a tensile storage elastic modulus at 100° C. of 0.003 GPa, a tensile storage elastic modulus at 110° C. being a Vicat softening point of 0.2 GPa, and a thickness of 60 µm was stacked.

Blue light emitting GaN-based LED chips were arranged with their sapphire substrate side located at the predetermined positions on the acryl-based elastomer sheet. The first light transmissive support was stacked on the LED chips so that the first conductive circuit layer was located on the electrode side of the LED chips. The stack was pressed with a pressure of 9.8 MPa while being heated to 160° C. in a vacuum atmosphere. The heating and pressurizing state was kept for one hour, whereby a light emitting device was produced. The obtained light emitting device was subjected to later-described characteristic evaluation.

Comparative Example 10

A light emitting device was produced as in Example 1 except that an acryl-based elastomer sheet having a Vicat softening temperature of 110° C., a glass transition temperature of −40° C., a melting temperature of 220° C., a tensile storage elastic modulus at 0° C. of 0.006 GPa, a tensile storage elastic modulus at 100° C. of 0.003 GPa, a tensile storage elastic modulus at 110° C. being a Vicat softening point of 0.002 GPa, and a thickness of 60 µm, and that thermocompression bonding was carried out in the atmosphere. The obtained light emitting device was subjected to later-described characteristic evaluation.

Comparative Example 11

A light emitting device was produced as in Example 1 except that an olefin-based hot melt adhesive sheet having a softening point by the ring and ball method of 145° C. and a thickness of 60 µm was used in place of the acryl-based elastomer sheet, and that the stack was hot-roll pressed under the conditions of 160° C. for 20 seconds in the atmosphere. This light emitting device was subjected to later-described characteristic evaluation.

Comparative Example 12

A light emitting device was produced as in Comparative Example 11 except that an olefin-based hot melt adhesive sheet having a thickness of 87.5 µm was used. This light emitting device was subjected to later-described characteristic evaluation.

TABLE 1

|  | Led Chip | Conductive Circuit Layer |
|---|---|---|
| Example 1 | Double-Sided Electrode Structure | Ito Particle Dispersed Layer |
| Example 2 | Double-Sided Electrode Structure | Ito Particle Dispersed Layer |
| Example 3 | Double-Sided Electrode Structure | Ito Particle Dispersed Layer |
| Example 4 | Double-Sided Electrode Structure | Ito Particle Dispersed Layer |
| Example 5 | Double-Sided Electrode Structure | Ito Particle Dispersed Layer |
| Example 6 | Double-Sided Electrode Structure | Ito Sputtered Film |
| Example 7 | Double-Sided Electrode Structure | Ito Sputtered Film |
| Example 8 | Double-Sided Electrode Structure | Ito Sputtered Film |
| Example 9 | Double-Sided Electrode Structure | Ito Sputtered Film |
| Example 10 | Double-Sided Electrode Structure | Ito Sputtered Film |
| Example 11 | Single-Sided Electrode Structure | Ito Particle Dispersed Layer |
| Example 12 | Single-Sided Electrode Structure | Ito Sputtered Film |
| Example 13 | Double-Sided Electrode Structure | Mesh Of Ag Particles |
| Example 14 | Double-Sided Electrode Structure | Mesh Of Ag Particles |
| Example 15 | Double-Sided Electrode Structure | Mesh Of Ag Particles |
| Example 16 | Double-Sided Electrode Structure | Mesh Of Ag Particles |
| Example 17 | Double-Sided Electrode Structure | Mesh Of Ag Particles |
| Example 18 | Single-Sided Electrode Structure | Mesh Of Ag Particles |
| Comparative Example 1 | Double-Sided Electrode Structure | Ito Particle Dispersed Layer |
| Comparative Example 2 | Double-Sided Electrode Structure | Ito Particle Dispersed Layer |
| Comparative Example 3 | Double-Sided Electrode Structure | Ito Particle Dispersed Layer |
| Comparative Example 4 | Double-Sided Electrode Structure | Ito Particle Dispersed Layer |
| Comparative Example 5 | Double-Sided Electrode Structure | Ito Particle Dispersed Layer |
| Comparative Example 6 | Double-Sided Electrode Structure | Ito Particle Dispersed Layer |
| Comparative Example 7 | Double-Sided Electrode Structure | Ito Particle Dispersed Layer |
| Comparative Example 8 | Single-Sided Electrode Structure | Ito Particle Dispersed Layer |
| Comparative Example 9 | Single-Sided Electrode Structure | Ito Particle Dispersed Layer |
| Comparative Example 10 | Double-Sided Electrode Structure | Ito Particle Dispersed Layer |
| Comparative Example 11 | Double-Sided Electrode Structure | Ito Particle Dispersed Layer |
| Comparative Example 12 | Double-Sided Electrode Structure | Ito Particle Dispersed Layer |

TABLE 2

|  | Insulating Resin Sheet | | | |
|---|---|---|---|---|
|  | Material | Vicat Softening Temperature [° C.] | Glass Transition Point [° C.] | Melting Temperature [° C.] |
| Example 1 | Acrylic Elastomer | 110 | −40 | 220 |
| Example 2 | Acrylic Elastomer | 90 | −32 | 140 |
| Example 3 | Acrylic Elastomer | 90 | −32 | 140 |
| Example 4 | Acrylic Elastomer | 160 | −40 | 240 |
| Example 5 | Acrylic Elastomer | 160 | −40 | 240 |
| Example 6 | Acrylic Elastomer | 110 | −40 | 220 |
| Example 7 | Acrylic Elastomer | 90 | −32 | 140 |
| Example 8 | Acrylic Elastomer | 90 | −32 | 140 |
| Example 9 | Acrylic Elastomer | 160 | −40 | 240 |
| Example 10 | Acrylic Elastomer | 160 | −40 | 240 |
| Example 11 | Acrylic Elastomer | 110 | −40 | 220 |
| Example 12 | Acrylic Elastomer | 110 | −40 | 220 |
| Example 13 | Acrylic Elastomer | 110 | −40 | 220 |
| Example 14 | Acrylic Elastomer | 90 | −32 | 140 |
| Example 15 | Acrylic Elastomer | 90 | −32 | 140 |
| Example 16 | Acrylic Elastomer | 160 | −40 | 240 |
| Example 17 | Acrylic Elastomer | 160 | −40 | 240 |
| Example 18 | Acrylic Elastomer | 110 | −40 | 220 |
| Comparative Example 1 | Acrylic Elastomer | 75 | −35 | 130 |
| Comparative Example 2 | Acrylic Elastomer | 170 | −10 | 240 |
| Comparative Example 3 | Acrylic Elastomer | 110 | −40 | 220 |
| Comparative Example 4 | Acrylic Elastomer | 110 | −40 | 230 |
| Comparative Example 5 | Acrylic Elastomer | 110 | −10 | 220 |
| Comparative Example 6 | Acrylic Elastomer | 110 | −10 | 220 |
| Comparative Example 7 | Acrylic Elastomer (with Through Holes) | 110 | −40 | 220 |
| Comparative Example 8 | (Acrylic Pressure Sensitive Adhesive) [Filled Between Bases] | 75 | −40 | — |
| Comparative Example 9 | Acrylic Elastomer (Arranged Only On LED Substrate Side) | 110 | −10 | 220 |

TABLE 2-continued

|  | Material | Insulating Resin Sheet | | |
|---|---|---|---|---|
|  |  | Vicat Softening Temperature [° C.] | Glass Transition Point [° C.] | Melting Temperature [° C.] |
| Comparative Example 10 | Acrylic Elastomer | 110 | −40 | 220 |
| Comparative Example 11 | Hot Melt Adhesive | 130*[1] | −20 | 150 |
| Comparative Example 12 | Hot Melt Adhesive | 130*[1] | −20 | 150 |

*[1]softening point (° C.) by the ring and ball method

TABLE 3

| | Insulating Resin Sheet Tensile Storage Elastic Modulus [Gpa] | | | Heating Temperature In Pressurization [° C.] |
|---|---|---|---|---|
| | 0° C. | 100° C. | Vicat Softening Temperature*[2] | |
| Example 1 | 1.1 | 0.3 | 0.2 | 120 |
| Example 2 | 0.8 | 0.1 | 0.2 | 100 |
| Example 3 | 0.8 | 0.1 | 0.2 | 120 |
| Example 4 | 1.9 | 0.6 | 0.3 | 150 |
| Example 5 | 1.9 | 0.6 | 0.3 | 160 |
| Example 6 | 1.1 | 0.3 | 0.2 | 120 |
| Example 7 | 0.8 | 0.1 | 0.2 | 100 |
| Example 8 | 0.8 | 0.1 | 0.2 | 80 |
| Example 9 | 1.9 | 0.6 | 0.2 | 160 |
| Example 10 | 1.9 | 0.6 | 0.2 | 170 |
| Example 11 | 1.1 | 0.3 | 0.3 | 120 |
| Example 12 | 1.1 | 0.3 | 0.3 | 120 |
| Example 13 | 1.1 | 0.3 | 0.3 | 120 |
| Example 14 | 0.8 | 0.1 | 0.2 | 80 |
| Example 15 | 0.8 | 0.1 | 0.2 | 100 |
| Example 16 | 1.9 | 0.6 | 0.2 | 170 |
| Example 17 | 1.9 | 0.6 | 0.2 | 160 |
| Example 18 | 1.1 | 0.3 | 0.2 | 120 |
| Comparative Example 1 | 0.7 | 0.08 | 0.5 | 90 |
| Comparative Example 2 | 2.5 | 0.9 | 0.008 | 180 |
| Comparative Example 3 | 1.1 | 0.003 | 0.001 | 120 |
| Comparative Example 4 | 0.01 | 0.008 | 0.005 | 120 |
| Comparative Example 5 | 11 | 1.5 | 0.9 | 120 |
| Comparative Example 6 | 0.008 | 0.003 | 0.001 | 120 |
| Comparative Example 7 | 0.006 | 0.003 | 0.001 | 120 |
| Comparative Example 8 | 0.005 | 0.002 | — | — |
| Comparative Example 9 | 0.006 | 0.003 | 0.001 | 120 |
| Comparative Example 10 | 0.006 | 0.003 | 0.002 | 120 |
| Comparative Example 11 | 0.03 | 0.005 | — | 170 |
| Comparative Example 12 | 0.03 | 0.005 | — | 170 |

*[2]means the tensile storage elastic modulus at the Vicat softening temperature.

Next, the characteristics of the light emitting devices in Examples 1 to 18 and Comparative Examples 1 to 12 were evaluated as follows. Twelve samples were produced for each of Examples 1 to 18 and Comparative Examples 1 to 12. For the 12 samples of each of the examples, the bending resistance test described in JIS C5016 (IEC249-1 and IEC326-2) 8.6 was carried out in an energization state. The bending test was carried out for all of the samples under the circumstances of a temperature of 20±2° C., a relative humidity of 60 to 70%, and a pressure of 86 to 106 kPa. Six samples were bent in an arrangement direction of the LED chips, and the remaining six samples were bent in a direction perpendicular to the arrangement direction of the LED chips so that the LED chip row was located at the center of the bent portion. The minimum bending radius (the minimum value of the bending radius with which lighting was maintained) of the sample bent in the direction perpendicular to the arrangement direction of the LED chips was investigated.

First, a plurality of kinds of circular cylinders for measurement having a uniform diameter with a radius of 100 mm to 5 mm and having a cross section in a true-circle shape were prepared. Then, the obtained light emitting device was set such that the rear surface of the light emitting surface of the LED chip was in contact with the curved surface on the surface of the circular cylinder for measurement. The light emitting device was made to light up and bent in this state at 180° along the curved surface on the surface of the circular cylinder for measurement. This bending test was carried out in order from a circular cylinder for measurement with a large radius to a circular cylinder for measurement with a small radius, and to which bending radius of the circular cylinder for measurement the lighting state was maintained, was measured. Further, for the samples which had not been bent, the thermal cycle test was carried out according to JIS C60068-14 between −20° C. and 60° C. to investigate the number of cycles with which the lighting state was able to be maintained. The thermal cycle test was carried out under the conditions of an exposure time of 30 minutes and a rate of heating of 3 K/min. These measurement and evaluation results are listed in Table 4.

TABLE 4

| | Bending Test | | Thermal Cycle Test | |
|---|---|---|---|---|
| | Minimum Bending Radius (mm) | Number of Lighting Samples | Number of Cycles | Number of Lighting Samples |
| Example 1 | 20 | 6/6 | 3000 | 6/6 |
| Example 2 | 20 | 6/6 | 3000 | 6/6 |
| Example 3 | 20 | 6/6 | 3000 | 6/6 |
| Example 4 | 30 | 6/6 | 2000 | 6/6 |
| Example 5 | 30 | 6/6 | 2400 | 6/6 |
| Example 6 | 40 | 6/6 | 3000 | 6/6 |
| Example 7 | 40 | 6/6 | 3000 | 6/6 |
| Example 8 | 40 | 6/6 | 3000 | 6/6 |
| Example 9 | 40 | 6/6 | 3000 | 6/6 |
| Example 10 | 40 | 6/6 | 3000 | 6/6 |
| Example 11 | 20 | 6/6 | 3000 | 6/6 |
| Example 12 | 40 | 6/6 | 3000 | 6/6 |
| Example 13 | 20 | 6/6 | 3000 | 6/6 |
| Example 14 | 40 | 6/6 | 3000 | 6/6 |
| Example 15 | 40 | 6/6 | 3000 | 6/6 |
| Example 16 | 40 | 6/6 | 3000 | 6/6 |
| Example 17 | 40 | 6/6 | 3000 | 6/6 |
| Example 18 | 40 | 6/6 | 3000 | 6/6 |
| Comparative Example 1 | 20 | 6/6 | 800 | 0/6 |
| Comparative Example 2 | 60 | 0/6 | 800 | 0/6 |
| Comparative Example 3 | 40 | 0/6 | 60 | 0/6 |
| Comparative Example 4 | 120 | 0/6 | 50 | 0/6 |
| Comparative Example 5 | 110 | 0/6 | 500 | 0/6 |
| Comparative Example 6 | 100 | 0/6 | 50 | 0/6 |
| Comparative Example 7 | 100 | 0/6 | 550 | 0/6 |
| Comparative Example 8 | 60 | 0/6 | 600 | 0/6 |
| Comparative Example 9 | 60 | 0/6 | 550 | 0/6 |
| Comparative Example 10 | 40 | 2/6 | 200 | 0/6 |
| Comparative Example 11 | 60 | 0/6 | 50 | 0/6 |
| Comparative Example 12 | 60 | 4/6 | 100 | 0/6 |

As is clear from Table 4, it was confirmed that each of the light emitting devices according to Examples 1 to 18 maintained lighting even in a state where the bending radius was made small in the bending resistance test, and was able to maintain the lighting state up to a sufficient number of cycles in the thermal cycle test. Accordingly, it is understood that each of the light emitting devices according to Examples 1 to 18 is excellent in bending resistance and thermal cycle resistance characteristics. In other words, it becomes possible to provide a light emitting device improved in electrical connection reliability between the conductive circuit layer and the electrode of the LED chip. Further, when bubbles and a state of swelling caused thereby were observed by the above-described method and determined for the Examples 1 to 18, it was confirmed that any of them had "no bubble."

Further, when bubbles and a state of swelling caused thereby were observed by the above-described method and determined for the light emitting devices in Comparative Examples 1 to 12, bubbles and swelling seemed to be caused thereby were not observed in the light emitting devices in Comparative Examples 1 to 9. However, in the light emitting devices in Comparative Examples 10 to 12, bubbles were observed at the peripheries of almost all of the LEDs, and swelling was observed at many transmissive conductors on both sides of the LEDs. In particular, in Comparative Example 11, the area of the bubble was large and its swelling was also large. Next, for confirming a filling structure of the third light transmissive insulator, the LED chip and its surroundings were observed under SEM. In the light emitting device in Comparative Example 11, voids were observed in a wide region about the periphery of the LED chip. In the light emitting devices in Comparative Examples 7 to 8, existence of the third light transmissive insulator at the contact interface between the second electrode and the conductive circuit layer was not confirmed.

Further, the light emitting devices in Comparative Examples 1 to 6, in which one of the Vicat softening temperature, glass transition temperature, and tensile storage elastic modulus of the third light transmissive insulator was out of the range of the present invention, and therefore were inferior in bending resistance and thermal cycle resistance characteristics. The light emitting devices in Comparative Example 7 and Comparative Example 9 were configured such that the LED chips were arranged in the through holes of the light transmissive insulating resin sheet, and were therefore inferior in adhesiveness between the LED chips and the third light transmissive insulator and failed to obtain excellent bending resistance and thermal cycle resistance characteristics. The light emitting device in Comparative Example 8 was almost the same as the light emitting device in Comparative Example 7, and inferior in bending resistance and thermal cycle resistance characteristics. It is presumed that the light emitting devices in Comparative Examples 10 to 12, in which remaining bubbles swelled and therefore the adhesion between the LED chips and the third light transmissive insulator was no longer maintained, resulted in their being inferior in bending resistance and thermal cycle resistance characteristics.

Examples 19 to 24, Comparative Examples 13 to 16

First, polyethylene terephthalate sheets having a thickness of 180 μm were prepared as first and second light transmissive insulators. On the surface of the polyethylene terephthalate sheet as the first light transmissive insulator, slurry made by dispersing ITO fine particles in an ultraviolet cure acryl-based transparent resin binder was printed to form a conductive circuit layer (thickness: 3 μm) in which six linearly arranged LED chips were connected in series, thereby producing a first light transmissive support. Also on the surface of the polyethylene terephthalate sheet as the second light transmissive insulator, a conductive circuit layer (thickness: 3 μm) was similarly formed to produce a second light transmissive support. As first and second light transmissive insulating resin sheets, acryl-based elastomer sheets having a Vicat softening temperature of 110° C., a melting temperature of 220° C., a glass transition temperature of −40° C., a tensile storage elastic modulus at 0° C. of 1.1 GPa, a tensile storage elastic modulus at 100° C. of 0.3 GPa, a tensile storage elastic modulus at 110° C. being a Vicat softening point of 0.2 GPa, and a thickness listed in Table 5 were prepared.

Six red light emitting AlGaAs/GaAs-based LED chips were prepared. The prepared LED chip includes a first electrode provided on the light emitting surface side of the chip body and a second electrode provided on the non-light emitting surface side of the chip body, and has a height $T_1$ of 175 μm. The first electrode has an area smaller than that of the light emitting surface of the chip body and has a shape projecting from the light emitting surface. A projecting amount of the first electrode from the light emitting surface is 3 μm. An area ratio of the forming surface of the first electrode to the light emitting surface of the chip body is about 20%. About 80% (area ratio) of the light emitting surface of the chip body is the non-forming surface of the electrode. The second electrode is formed on the entire non-light emitting surface of the chip body and its surface is provided with fine projections and recesses.

On the conductive circuit layer of the second light transmissive support, the second light transmissive insulating resin sheet was placed to cover the entire conductive circuit layer and light transmissive insulator, and the six LED chips were arranged at predetermined positions on the second light transmissive insulating resin sheet so that the distance between the chips (the minimum distance d) was the value listed in Table 5. The six LED chips were arranged such that their second electrodes were located on the second light transmissive insulating resin sheet side. Then, on the six LED chips, the first light transmissive insulating resin sheet and the first light transmissive support were stacked. The first light transmissive insulating resin sheet was arranged such that the conductive circuit layer of the first light transmissive support was located on the first light transmissive insulating resin sheet side. The first light transmissive insulating resin sheet has a shape covering the entire conductive circuit layer and light transmissive insulator of the first light transmissive support.

Then, a stack in which the second light transmissive support, the second light transmissive insulating resin sheet, the LED chips, the first light transmissive insulating resin sheet, and the first light transmissive support were stacked in order was preliminarily pressed with a pressure of 0.1 MPa, and then a working space was evacuated to 5 kPa. The stack was pressed with a pressure of 10 MPa while being heated to 120° C. in such a vacuum atmosphere. This heating and pressurizing state was kept for 10 minutes to embed the first and second light transmissive insulating resin sheets between the first light transmissive support and the second light transmissive support to thereby form a third light transmissive insulator, while electrically connecting the electrodes of the LED chips and the conductive circuit layers. Thereafter, sealing processing using an ultraviolet cure resin was performed on an end face, thereby producing a light emitting device. The difference ΔT ($T_1$−$T_2$) between the height $T_1$ of the LED chip and the minimum thickness $T_2$ of the third light transmissive insulator is as listed in Table 5. Note that Comparative Examples in Table 5 have a thickness difference ΔT out of the range of the present invention.

For the light emitting devices in Working Examples 19 to 24 thus obtained, presence or absence of bubbles in the light emitting device were confirmed. The evaluation of the bubbles was carried out as follows. The front surface or the rear surface of the light emitting device was visually observed, and the presence or absence of bubbles was primarily confirmed. Samples in which bubbles were not observed in the primary confirmation were determined to have no bubbles, and the inspection was finished. Sample in which bubbles were observed in the primary inspection were subjected to photographing of the bubbles using a microscope with camera. Using the photograph, a distance between arbitrary two points on a contour of the bubble was measured, and a length having a maximum distance was defined as an outer diameter. Then, the case where the outer diameter of the bubble was an LED chip size or more, or 500 μm or more was determined to have bubbles, and samples other than those were determined to have no bubbles. As a result, in the light emitting devices in Working Examples 19 to 24, visible bubbles were not observed. On the other hand, in Comparative Examples 13 to 16, a region looked as bubbles was visually confirmed in a part between the LED chips in the light emitting device. Further, as a result of SEM observation, it was confirmed that there was a portion where the third light transmissive insulator was not filled between the LED chips.

For confirming a filling structure of the third light transmissive insulator, the LED chip and its surroundings were observed under SEM. As a result, in each of the light emitting devices in Examples 19 to 24, it was confirmed that the third light transmissive insulator was successfully filled between the non-forming surface of the first electrode of the LED chip and the conductive circuit layer, and between the non-forming surface of the second electrode of the LED chip and the conductive circuit layer. Further, it was confirmed that the electrical connection regions where the electrode and the conductive circuit layer were in direct contact with each other and the mechanical coupling regions where the third light transmissive insulator intervened between the electrode and the conductive circuit layer, were formed on the contact interface between the first electrode and the conductive circuit layer and on the contact interface between the second electrode and the conductive circuit layer in any of Working Examples.

Next, the characteristics of the above-described light emitting device were evaluated as follows. Eighteen samples were produced for each of examples listed in Table 5. For the 18 samples of each of the examples, the bending resistance test described in JIS C5016 (IEC249-1 and IEC326-2) 8.6 was carried out in an energization state. Six samples were bent in a direction perpendicular to an arrangement direction of the LED chips so that the LED chip row was located at the center of the bent portion, and other six samples were bent in the arrangement direction of the LED chips. Each sample was bent at 180° with a bending radius set to 40 mm, and the number of samples in which the lighting state of the LED chips was maintained at that time was investigated. The bending test was carried out for all of the samples under the circumstances of a temperature of 20±2° C., a relative humidity of 60 to 70%, and a pressure of 86 to 106 kPa. Further, the remaining six samples were subjected to the thermal cycle test according to JIS C60068-14 between −20° C. and 60° C., and the numbers of samples in which the lighting state of the LED chips was maintained after 1000 cycles and after 3000 cycles were investigated. The thermal cycle test was carried out under the conditions of an exposure time of 30 minutes and a rate of heating of 3 K/min. These measurement and evaluation results are listed in Table 5.

TABLE 5

|  | Minimum Distance D Between LED Chips [μm] | Thickness Of First And Second Insulating Resin Sheets [μm] | Thickness Difference Δt [μm] | Bending Test | | Thermal Cycle Test Result | |
| --- | --- | --- | --- | --- | --- | --- | --- |
|  |  |  |  | Bend In Direction Perpendicular To Led Row | Bend In Direction of Led Row | After 1000 Cycles | After 3000 Cycles |
| Exam 19 | 550 | 85 | 5 | 6/6 | 6/6 | 6/6 | 6/6 |
| Exam 20 | 600 | 62 | 51 | 6/6 | 6/6 | 6/6 | 6/6 |
| Exam 21 | 800 | 58 | 59 | 6/6 | 6/6 | 6/6 | 6/6 |
| Exam 22 | 1000 | 60 | 55 | 6/6 | 6/6 | 6/6 | 6/6 |
| Exam 23 | 1000 | 48 | 79 | 6/6 | 6/6 | 6/6 | 6/6 |
| Exam 24 | 1500 | 48 | 79 | 6/6 | 6/6 | 6/6 | 6/6 |
| Comp. Exam 13 | 400 | 75 | 25 | 0/6 | 0/6 | 0/6 | 0/6 |
| Comp. Exam 14 | 700 | 52 | 71 | 0/6 | 0/6 | 2/6 | 0/6 |
| Comp. Exam 15 | 1000 | 36 | 103 | 2/6 | 0/6 | 3/6 | 0/6 |
| Comp. Exam 16 | 1500 | 40 | 95 | 2/6 | 0/6 | 3/6 | 0/6 |

As is clear from Table 5, it was confirmed that each of the light emitting devices according to Examples 19 to 24 maintained lighting even in a state where the bending radius was made small in the bending resistance test, and was able to maintain the lighting state up to a sufficient number of cycles in the thermal cycle test. Accordingly, it is understood that each of the light emitting devices according to Examples 19 to 24 is excellent in bending resistance and thermal cycle resistance characteristics. In other words, it was possible to provide light emitting devices improved in electrical connection reliability between the conductive circuit layer and the electrode of the LED chip and the reliability of the LED chip. On the other hand, the light emitting devices according to Comparative Examples 13 to 16 failed to exhibit such characteristics. This seems because a portion, which was not mechanically and electrically connected, remained between the electrode of the LED chip and the conductive circuit layer in the light emitting device.

Examples 25 to 27, Comparative Examples 17 to 19

Polyethylene terephthalate sheets having a thickness of 180 μm were prepared as first and second light transmissive insulators. On the surface of the polyethylene terephthalate sheet as the first light transmissive insulator, a conductive circuit layer having a thickness of 3 μm was formed as in Example 19 to produce a first light transmissive support. The polyethylene terephthalate sheet as the second light transmissive insulator was used as it was as the second light transmissive support. As the light transmissive insulating resin sheet, an acryl-based elastomer sheet having the same physical properties as those in Example 19 and a thickness as listed in Table 6 was prepared.

Six blue light emitting GaN-based LED chips were prepared. The prepared LED chip includes first and second electrodes provided on the light emitting surface side of the chip body, and has a height $T_1$ of 90 μm. Each of the first and second electrodes has an area smaller than that of the light emitting surface of the chip body and has a shape projecting from the light emitting surface. A projecting amount of the electrode from the light emitting surface is 1 μm. An area ratio of the forming surface of the first and second electrodes to the light emitting surface of the chip body is about 15%. About 70% (area ratio) of the light emitting surface of the chip body is the non-forming surface of the electrodes.

On the conductive circuit layer of the first light transmissive support, the light transmissive insulating resin sheet was placed to cover the entire conductive circuit layer and light transmissive insulator, and the six LED chips were arranged at predetermined positions on the light transmissive insulating resin sheet so that the distance between the chips (the minimum distance d) was the value listed in Table 6. The six LED chips were arranged such that their first and second electrodes were located on the light transmissive insulating resin sheet side. Further, on the six LED chips, the second light transmissive support was stacked.

Then, a stack in which the first light transmissive support, the light transmissive insulating resin sheet, the LED chips, and the second light transmissive support were stacked in order was preliminarily pressed with a pressure of 0.1 MPa, and then a working space was evacuated to 5 kPa. The stack was pressed with a pressure of 30 MPa while being heated to 120° C. in such a vacuum atmosphere. This heating and pressurizing state was kept for 10 minutes to embed the first and second light transmissive insulating resin sheets between the first light transmissive support and the second light transmissive support to thereby form a third light transmissive insulator, while electrically connecting the electrodes of the LED chips and the conductive circuit layer.

Thereafter, sealing processing using an ultraviolet cure resin was performed on an end face, thereby producing a light emitting device. The difference $\Delta T$ ($T_1$-$T_2$) between the height $T_1$ of the LED chip and the minimum thickness $T_2$ of the third light transmissive insulator is as listed in Table 6. Note that Comparative Examples in Table 6 have a thickness difference $\Delta T$ out of the range of the present invention.

For the light emitting devices in Examples 25 to 27 and Comparative Examples 17 to 19 thus obtained, presence or absence of bubbles in the light emitting device and a filling state of the third light transmissive insulator between the LED chip and its surroundings were observed as in Example 19. As a result, in the light emitting devices in Examples 25 to 27, visible bubbles were not observed. InExamples 25 to 27, it was confirmed that the third light transmissive insulator was successfully filled between the non-forming surface of the electrode of the LED chip and the conductive circuit layer, and the electrical connection regions where the electrode and the conductive circuit layer were in direct contact and the mechanical coupling regions where the third light transmissive insulator intervened between the electrode and the conductive circuit layer, were formed on the contact interface between the electrode and the conductive circuit layer. On the other hand, in Comparative Examples 17 to 19, a region looked as bubbles was visually confirmed in a part between the LED chips in the light emitting device, and, as a result of SEM observation, it was confirmed that there was a portion where the third light transmissive insulator was not filled between the LED chips.

Next, the characteristics of the above-described light emitting device were evaluated as follows. Eighteen samples were produced for each of examples listed in Table 6. For the 18 samples of each of the examples, the bending resistance test described in JIS C5016 (IEC249-1 and IEC326-2) 8.6 was carried out in an energization state. Six samples were bent in a direction perpendicular to an arrangement direction of the LED chips so that the LED chip row was located at the center of the bent portion, and other six samples were bent in the arrangement direction of the LED chips. Each sample was bent at 180° with a bending radius set to 40 mm, and the number of samples in which the lighting state of the LED chips was maintained at that time was investigated. Further, the remaining six samples were subjected to the thermal cycle test according to JIS C60068-14 between −20° C. and 60° C., and the numbers of samples in which the lighting state of the LED chips was maintained after 1000 cycles and after 3000 cycles were investigated. The thermal cycle test was carried out under the conditions of an exposure time of 30 minutes and a rate of heating of 3 K/min. These measurement and evaluation results are listed in Table 6.

TABLE 6

| | Minimum Distance D Between LED Chips [μm] | Thickness Of First And Second Insulating Resin Sheets [μm] | Thickness Difference Δt [μm] | Bending Test | | Thermal Cycle Test Result | |
|---|---|---|---|---|---|---|---|
| | | | | Bend In Direction Perpendicular To Led Row | Bend In Direction of Led Row | After 1000 Cycles | After 3000 Cycles |
| Exam 25 | 600 | 45 | 45 | 6/6 | 6/6 | 6/6 | 6/6 |
| Exam 26 | 800 | 60 | 30 | 6/6 | 6/6 | 6/6 | 6/6 |
| Exam 27 | 1000 | 50 | 40 | 6/6 | 6/6 | 6/6 | 6/6 |

TABLE 6-continued

|  | Minimum Distance D Between LED Chips [μm] | Thickness Of First And Second Insulating Resin Sheets [μm] | Thickness Difference Δt [μm] | Bending Test | | Thermal Cycle Test Result | |
|---|---|---|---|---|---|---|---|
|  |  |  |  | Bend In Direction Perpendicular To Led Row | Bend In Direction of Led Row | After 1000 Cycles | After 3000 Cycles |
| Comp. Exam 17 | 400 | 50 | 40 | 0/6 | 0/6 | 0/6 | 0/6 |
| Comp. Exam 18 | 500 | 40 | 50 | 0/6 | 0/6 | 2/6 | 0/6 |
| Comp. Exam 19 | 1000 | 30 | 60 | 2/6 | 1/6 | 3/6 | 0/6 |

As is clear from Table 6, it was confirmed that each of the light emitting devices according to Examples 25 to 27 maintained lighting even in a state where the bending radius was made small in the bending resistance test, and was able to maintain the lighting state up to a sufficient number of cycles in the thermal cycle test. Accordingly, it is understood that each of the light emitting devices according to Examples 25 to 27 is excellent in bending resistance and thermal cycle resistance characteristics. In other words, it becomes possible to provide a light emitting device improved in electrical connection reliability between the conductive circuit layer and the electrode of the LED chip and the reliability of the LED chip.

While certain embodiments of the present invention have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such embodiments or modifications as would fall within the scope and spirit of the inventions.

The invention claimed is:

1. A light emitting device comprising:
a first light transmissive support including a first light transmissive insulator and a first conductive circuit layer provided on a first surface of the first light transmissive insulator;
a second light transmissive support including a second light transmissive insulator and a second conductive circuit layer provided on a second surface of the second light transmissive insulator opposed to the first surface;
a plurality of light emitting diodes, arranged between the first light transmissive insulator and the second light transmissive insulator so that a minimum distance d is 500 μm or more, each including a first electrode electrically connecting to the first conductive circuit layer, and a second electrode electrically connecting to the second conductive circuit layer; and
a third light transmissive insulator embedded between the first light transmissive insulator and the second light transmissive insulator,
wherein the third light transmissive insulator has a minimum thickness $T_2$ between the plural light emitting diodes, which is smaller than a height $T_1$ of the light emitting diode by a range of 5 μm or more and ½ or less of the height $T_1$, and
wherein a difference $\Delta T$ ($T_1-T_2$) between the height $T_1$ of the light emitting diode and the minimum thickness $T_2$ of the third light transmissive insulator falls within a range surrounded by a straight line 1 expressed by $\Delta T=5$, a straight line 2 expressed by d=500, a straight line 3 expressed by $\Delta T=0.09d$, a straight line 4 expressed by $\Delta T=0.0267d+60$, and a straight line 5 expressed by $\Delta T=\frac{1}{2} T_1$, in a graph with the difference $\Delta T$ [unit:μm] plotted on a vertical axis and the minimum distance d [unit:μm] between the plural light emitting diodes plotted on a horizontal axis.

2. The light emitting device according to claim 1, wherein the minimum distance d between the plural light emitting diodes is 1500 μm or less.

3. The light emitting device according to claim 1, wherein the third light transmissive insulator has a Vicat softening temperature of 80° C. or higher and 160° C. or lower.

4. The light emitting device according to claim 1, wherein the third light transmissive insulator has a tensile storage elastic modulus of 0.01 GPa or more and 10 GPa or less.

5. The light emitting device according to claim 1, wherein a glass transition temperature of the third light transmissive insulator is −20° C. or lower.

6. The light emitting device according to claim 3, wherein a melting temperature of the third light transmissive insulator is 180° C. or higher, or higher by 40° C. or more than the Vicat softening temperature.

7. The light emitting device according to claim 1, wherein a contact interface between the first electrode or the second electrode and the conductive circuit layer has an electrical connection region where the electrode and the conductive circuit layer are in direct contact with each other and a mechanical coupling region where the electrode and the conductive circuit layer are coupled with each other with the third light transmissive insulator intervening therebetween.

8. The light emitting device according to claim 7, wherein a contact surface of the electrode with the conductive circuit layer has a projecting and recessed shape, and a projection in the projecting and recessed shape is in direct contact with the conductive circuit layer to form the electrical connection region, and the third light transmissive insulator is filled in the recess in the projecting and recessed shape to form the mechanical coupling region.

9. The light emitting device according to claim 1, wherein at least one of the first light transmissive insulator and the second light transmissive insulator has flexibility.

10. A light emitting device comprising:
a first light transmissive support including a first light transmissive insulator and a conductive circuit layer provided on a first surface of the first light transmissive insulator;
a second light transmissive support including a second light transmissive insulator;
a plurality of light emitting diodes, arranged between the first light transmissive insulator and the second light transmissive insulator so that a minimum distance d is 500 μm or more, each including a first electrode and a second electrode electrically connecting to the conductive circuit layer; and
a third light transmissive insulator embedded between the first light transmissive insulator and the second light transmissive insulator,
wherein the third light transmissive insulator has a minimum thickness $T_2$ between the plural light emitting diodes, which is smaller than a height $T_1$ of the light emitting diode by a range of 5 μm or more and ½ or less of the height $T_1$, and
wherein a difference $\Delta T$ ($T_1-T_2$) between the height $T_1$ of the light emitting diode and the minimum thickness $T_2$ of the third light transmissive insulator falls within a range surrounded by a straight line 1 expressed by $\Delta T=5$, a straight line 2 expressed by d=500, a straight line 3 expressed by $\Delta T=0.09d$, a straight line 4 expressed by $\Delta T=0.0267d+60$, and a straight line 5 expressed by $\Delta T=½ T_1$, in a graph with the difference $\Delta T$ [unit: μm] plotted on a vertical axis and the minimum distance d [unit:μm] between the plural light emitting diodes plotted on a horizontal axis.

11. The light emitting device according to claim 10,
wherein the minimum distance d between the plural light emitting diodes is 1500 μm or less.

12. The light emitting device according to claim 10,
wherein the third light transmissive insulator has a Vicat softening temperature of 80° C. or higher and 160° C. or lower.

13. The light emitting device according to claim 10,
wherein the third light transmissive insulator has a tensile storage elastic modulus of 0.01 GPa or more and 10 GPa or less.

14. The light emitting device according to claim 10,
wherein a glass transition temperature of the third light transmissive insulator is −20° C. or lower.

15. The light emitting device according to claim 12,
wherein a melting temperature of the third light transmissive insulator is 180° C. or higher, or higher by 40° C. or more than the Vicat softening temperature.

16. The light emitting device according to claim 10,
wherein a contact interface between the first electrode or the second electrode and the conductive circuit layer has an electrical connection region where the electrode and the conductive circuit layer are in direct contact with each other and a mechanical coupling region where the electrode and the conductive circuit layer are coupled with each other with the third light transmissive insulator intervening therebetween.

17. The light emitting device according to claim 16,
wherein a contact surface of the electrode with the conductive circuit layer has a projecting and recessed shape, and a projection in the projecting and recessed shape is in direct contact with the conductive circuit layer to form the electrical connection region, and the third light transmissive insulator is filled in the recess in the projecting and recessed shape to form the mechanical coupling region.

18. The light emitting device according to claim 10,
wherein at least one of the first light transmissive insulator and the second light transmissive insulator has flexibility.

19. An apparatus comprising the light emitting device according to claim 1.

20. An apparatus comprising the light emitting device according to claim 10.

* * * * *